US012660243B2

(12) United States Patent
Lin et al.

(10) Patent No.: US 12,660,243 B2
(45) Date of Patent: Jun. 16, 2026

(54) METHOD FOR FORMING AN ISOLATION REGION IN A SEMICONDUCTOR DEVICE STRUCTURE

(71) Applicant: TAIWAN SEMICONDUCTOR MANUFACTURING COMPANY, LTD., Hsinchu (TW)

(72) Inventors: Tzu-Ging Lin, Kaohsiung (TW);
Chen-Yu Tai, Miaoli (TW);
Chun-Liang Lai, Hsinchu (TW);
Chih-Chang Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 970 days.

(21) Appl. No.: 17/837,833

(22) Filed: Jun. 10, 2022

(65) Prior Publication Data
US 2023/0402521 A1      Dec. 14, 2023

(51) Int. Cl.
H10D 30/67 (2025.01)
H10D 62/10 (2025.01)
H10D 84/01 (2026.01)
H10D 84/03 (2025.01)
H10D 84/83 (2025.01)

(52) U.S. Cl.
CPC ..... H10D 30/6735 (2025.01); H10D 30/6757 (2025.01); H10D 62/118 (2025.01); H10D 84/0151 (2025.01); H10D 84/038 (2025.01); H10D 84/83 (2025.01)

(58) Field of Classification Search
CPC .............. H10D 84/01; H10D 30/6735; H10D 30/6737; H10D 54/038; H10D 84/83;
H10D 64/017; H10D 30/791; H10D 84/0151; H10D 84/0135; H10D 84/931;
H01L 21/31053; H01L 21/3086; H01L 21/302; H01L 21/3065; H01L 21/30655;
H01L 21/76224; H01L 21/76; H01L 21/76232; H01L 21/764
See application file for complete search history.

(56) References Cited

U.S. PATENT DOCUMENTS

| | | | |
|---|---|---|---|
| 10,720,526 B2 | 7/2020 | Ko et al. | |
| 2019/0229010 A1* | 7/2019 | Lin ..................... | H10D 84/0151 |
| 2020/0006557 A1* | 1/2020 | Ko ........................ | H10D 30/792 |
| 2020/0135849 A1* | 4/2020 | Chiang ................ | H10D 62/115 |
| 2021/0134797 A1* | 5/2021 | Lin ...................... | H10D 84/038 |

* cited by examiner

*Primary Examiner* — Julio J Maldonado
*Assistant Examiner* — Alexander Michael Miller
(74) *Attorney, Agent, or Firm* — NZ Carr Law Office

(57) ABSTRACT

A semiconductor device structure, along with methods of forming such, are described. The semiconductor device structure includes a substrate and an isolation structure disposed on the substrate and between two neighboring transistors. The isolation structure includes a dielectric feature, an insulating material disposed below the dielectric feature. The insulating material includes an upper portion comprising a first sidewall and a top surface in contact with the dielectric feature, and a bottom portion having a second sidewall, wherein the second sidewall is surrounded by and in contact with the substrate. The insulating material further includes a middle portion having a third sidewall disposed between the first sidewall and the second sidewall. The semiconductor device structure also includes a dielectric material in contact with the dielectric feature, the first sidewall, the third sidewall, and the substrate.

20 Claims, 26 Drawing Sheets

100

1102
1102
1102

1112 ⎫
1110 ⎭ 1108
1202
1106
1104
1204 ⎫
1206 ⎭ 904
906

704 ⎫
702 ⎭ 908
107
102b
202b

1202

906
602
106
108
106
108
106
108
} 104
402
102a
202a
304
101

H2
H1

100

1102 1102
1102

1112 } 1108
1110
1202
1106
1104
1204 } 904
1206

906

704 } 908
702
107
102b
202b

1202

906

106
106
106
1402

402
102a
202a
304
101

906

METHOD FOR FORMING AN ISOLATION REGION IN A SEMICONDUCTOR DEVICE STRUCTURE

BACKGROUND

As the semiconductor industry has progressed into nanometer technology process nodes in pursuit of higher device density, higher performance, and lower costs, challenges from both fabrication and design issues have resulted in the development of multi-gate devices, such as fin field-effect transistors (FinFETs) and gate-all-around (GAA) transistors. To continue to provide the desired scaling and increased density for multi-gate devices in advanced technology nodes, continued reduction of the gate pitch is necessary. Various schemes, such as poly on diffusion edge (PODE) and continuous poly on diffusion edge (CPODE), have been used to scale the gate pitch while preventing leakage current between transistors. However, such schemes cannot provide the level of device density, cell isolation, and device performance required for aggressively scaled circuits and devices.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
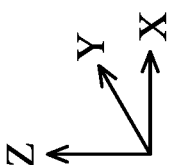
FIGS. 1-17 are perspective views of various stages of manufacturing a semiconductor device structure, in accordance with some embodiments.
Figure 1:
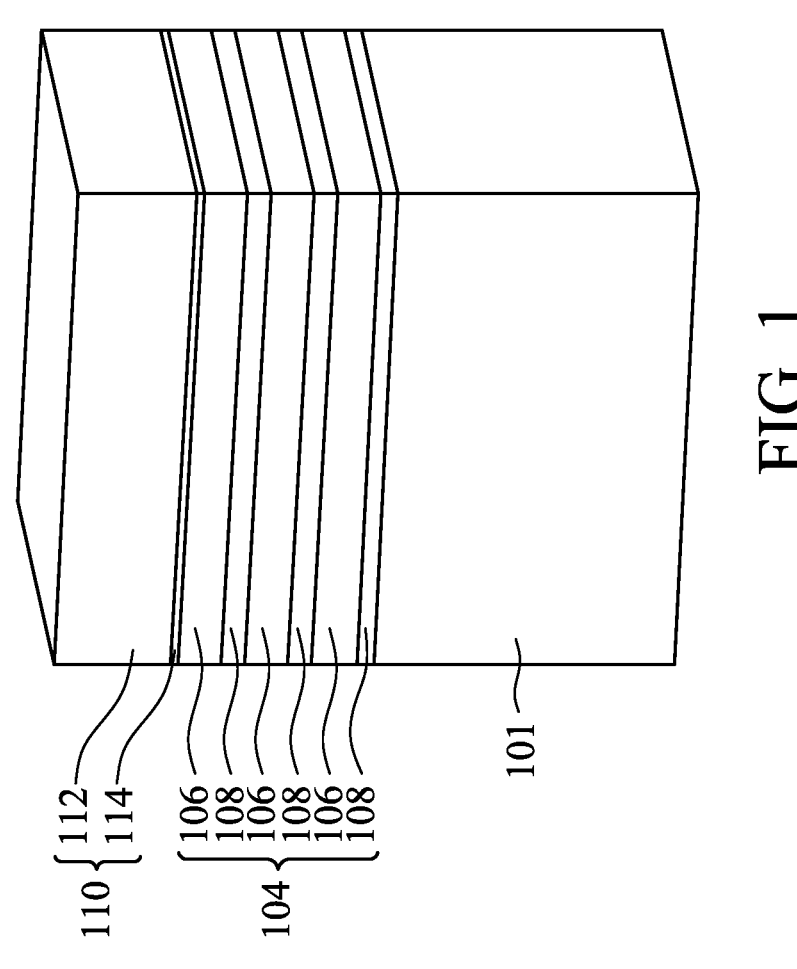

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure.

FIGS. 1-25B show exemplary sequential processes for manufacturing a semiconductor device structure 100, in accordance with some embodiments. It is understood that additional operations can be provided before, during, and after processes shown by FIGS. 1-25B and some of the operations described below can be replaced or eliminated, for additional embodiments of the method. The order of the operations/processes may be interchangeable.

FIGS. 1-17 are perspective views of various stages of manufacturing the semiconductor device structure 100, in accordance with some embodiments. As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of Si. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the first semiconductor layers 106 may be made of SiGe having a first Ge concentration range, and the second semiconductor layers 108 may be made of SiGe having a second Ge concentration range that is lower or greater than the first Ge concentration range. In some embodiments, the stack of semiconductor layers 104 includes alternating first and second semiconductor layers 106, 108. The first semiconductor layers 106 or portions thereof may form nanosheet channel(s) of the semiconductor device structure 100 at a later stage. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below. In some embodiments, the first and second semiconductor layers 106, 108 are replaced with a single semiconductor material connected to the substrate 101, and the device is a FinFET.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A mask structure 110 is formed over the stack of semiconductor layers 104. The mask structure 110 may include an oxygen-containing layer 112 and a nitrogen-containing layer 114. The oxygen-containing layer 112 may be a pad oxide layer, such as a $SiO_2$ layer. The nitrogen-containing layer 114 may be a pad nitride layer, such as $Si_3N_4$. The mask structure 110 may be formed by any suitable deposition process, such as chemical vapor deposition (CVD) process.

Figure 2:
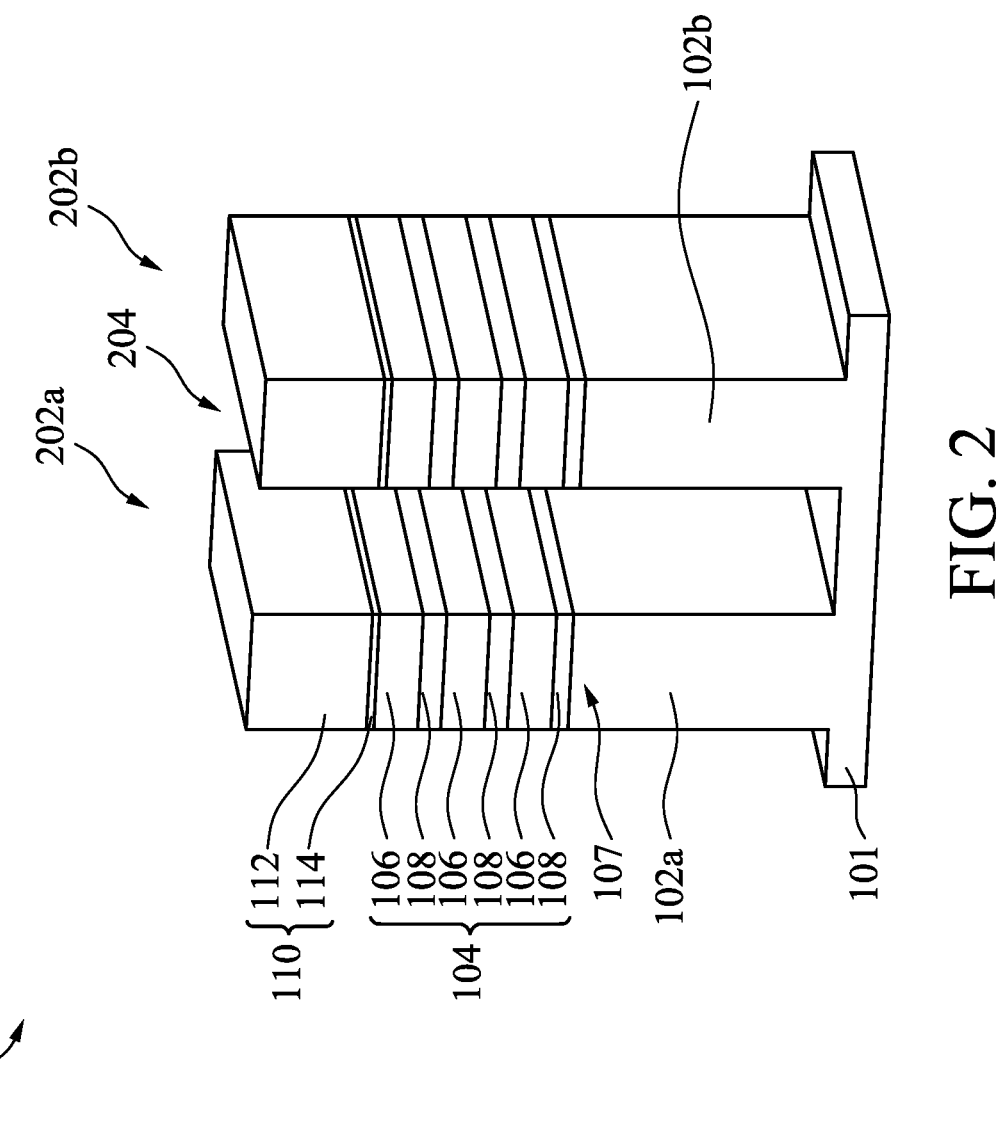

In FIG. 2, fins 202a and 202b are formed. In some embodiments, each fin 202a, 202b includes a substrate portion 102a, 102b formed from the substrate 101, a portion of the stack of semiconductor layers 104, and a portion of the mask structure 110. Each fin 202a, 202b may also include a well portion 107 (having n-type or p-type dopants) at or near the interface between the bottommost second semiconductor layer 108 and the substrate portion 102a, 102b. The fins 202a, 202b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202a, 202b by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two. Three or more fins are arranged along the X direction in some embodiments, as shown in FIGS. 18A-B to 26A-B.

In some embodiments, the fins 202a, 202b may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 104, and into the substrate 101, thereby leaving the fins 202a, 202b extended upwardly from the substrate 101. The trenches 204 may be etched using a dry etch (e.g., RIE), a wet etch, and/or combination thereof.

Figure 3:
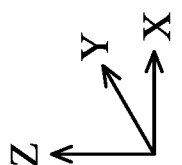
Figure 3:
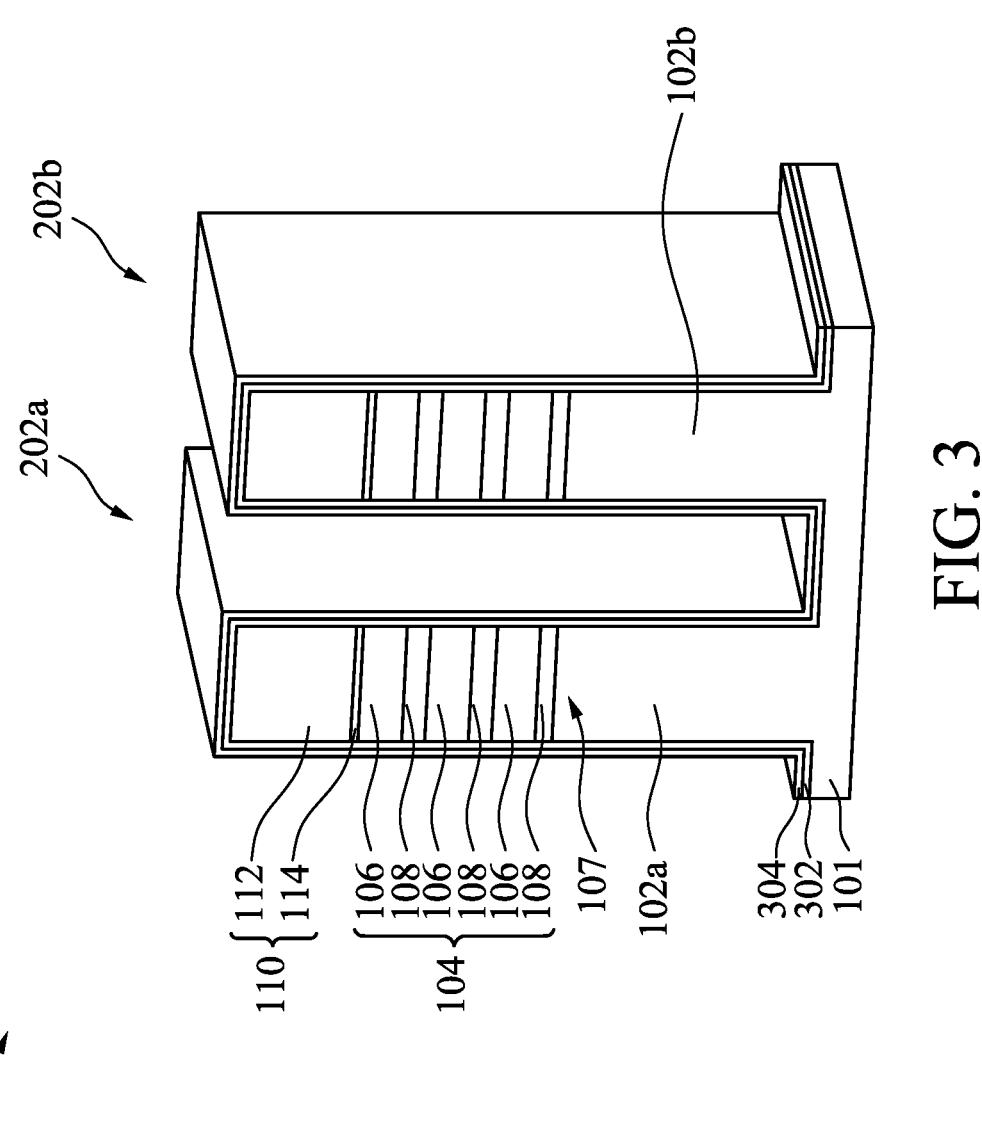

In FIG. 3, a liner 304 is formed over the substrate 101 and the fins 202a, 202b. In some embodiments, an optional liner 302 may be first formed on the substrate 101 and fins 202a, 202b, and the liner 304 is formed on the optional liner 302. The liner 304 may be made of a semiconductor material, such as Si. In some embodiments, the liner 304 is made of the same material as the substrate 101. In some embodiments, the liner 302 and the liner 304 are both optional. In such cases, a subsequent insulating material 402 are in direct contact with the substrate portions 102a, 102b. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
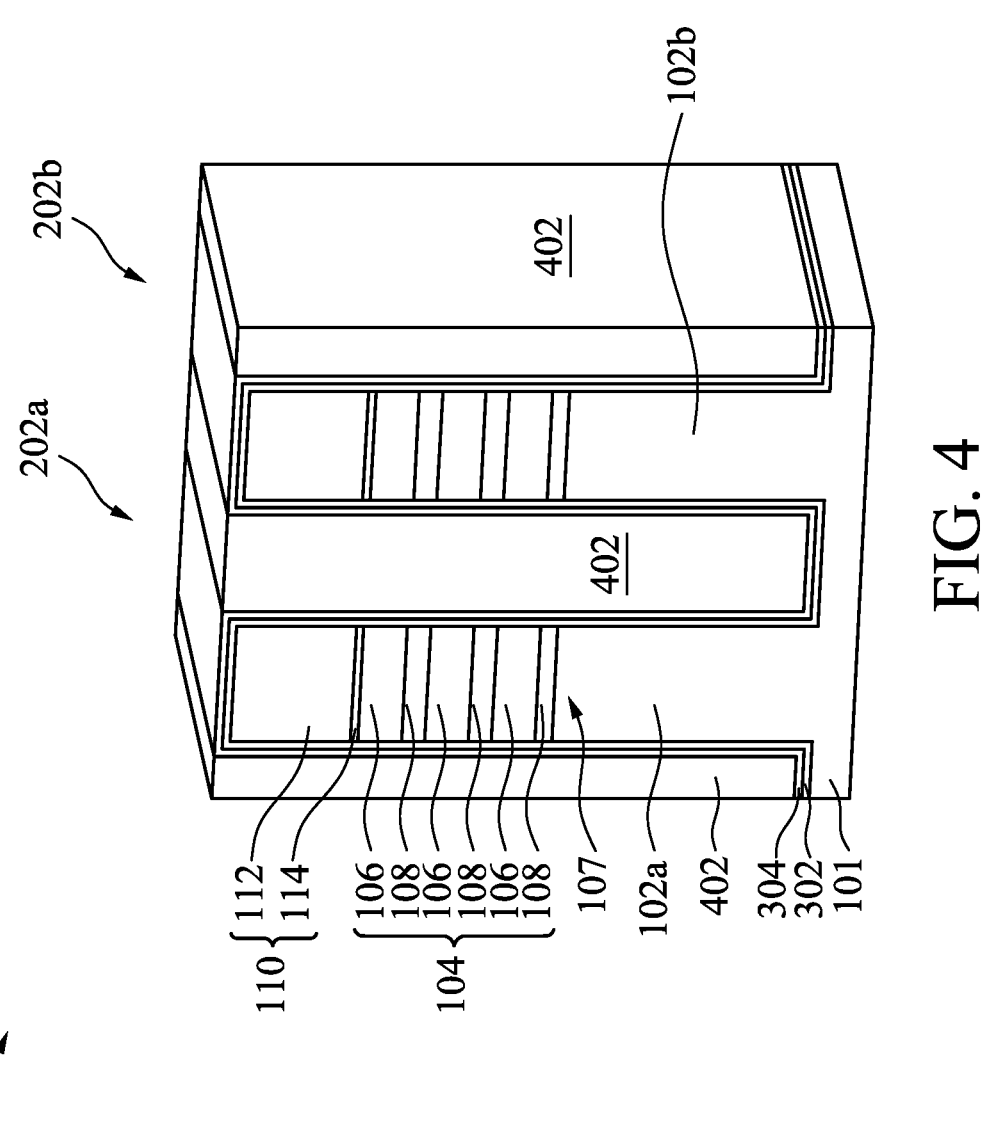

In FIG. 4, an insulating material 402 is formed on the substrate 101. The insulating material 402 fills the trench 204 (FIG. 3). The insulating material 402 may be first formed over the substrate 101 so that the fins 202a, 202b are embedded in the insulating material 402. Then, a planarization operation, such as a chemical mechanical polishing (CMP) process and/or an etch-back process, is performed such that the tops of the fins 202a, 202b (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
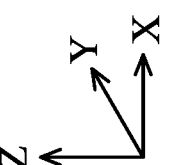
Figure 5:
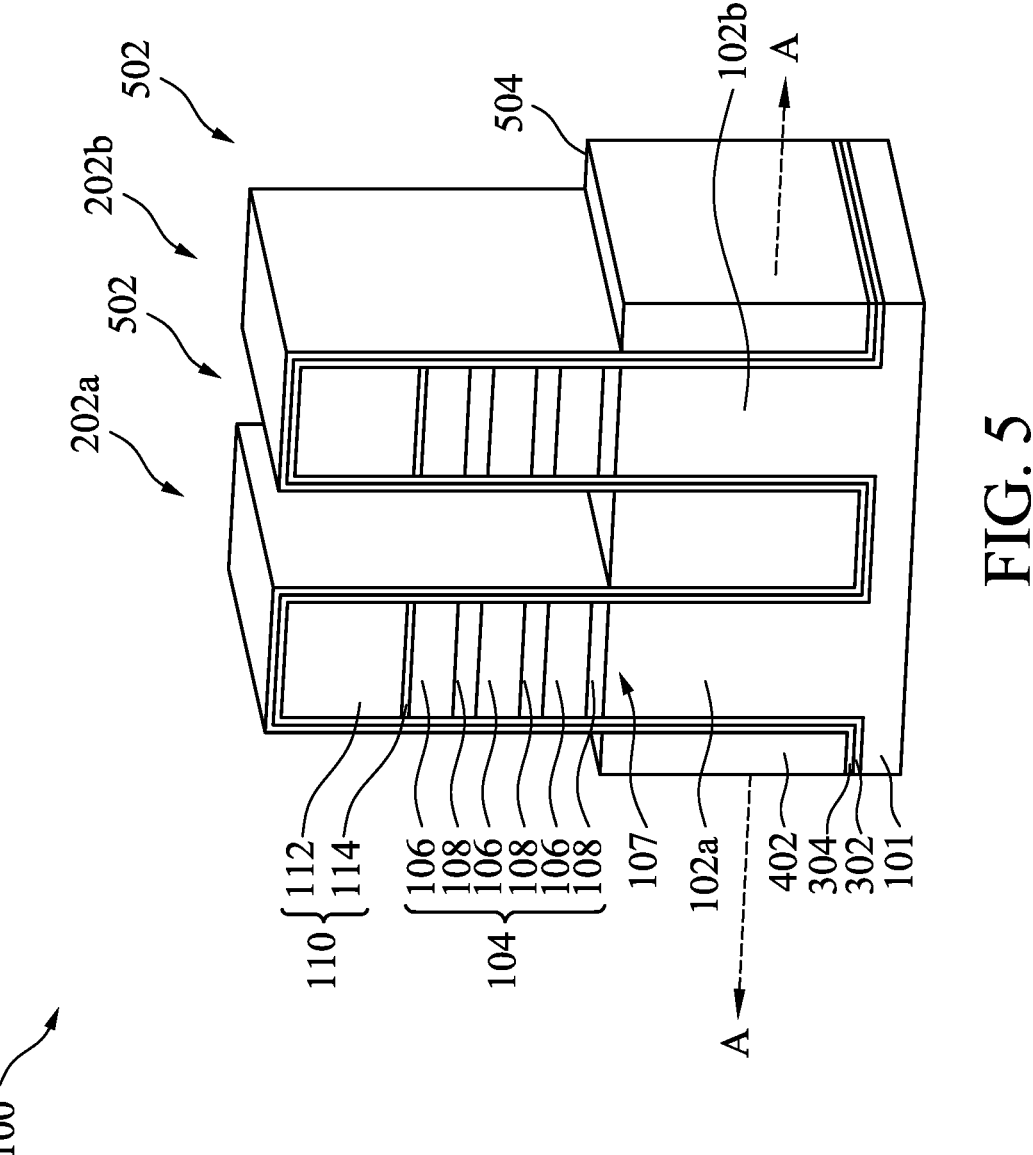

In FIG. 5, the insulating material 402 is recessed by removing a portion of the insulating material 402 located between adjacent fins 202*a*, 202*b* to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the second semiconductor layers 108 in contact with the substrate portions 102*a*, 102*b* of the substrate 101.

Figure 6:
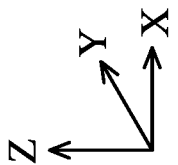
Figure 6:
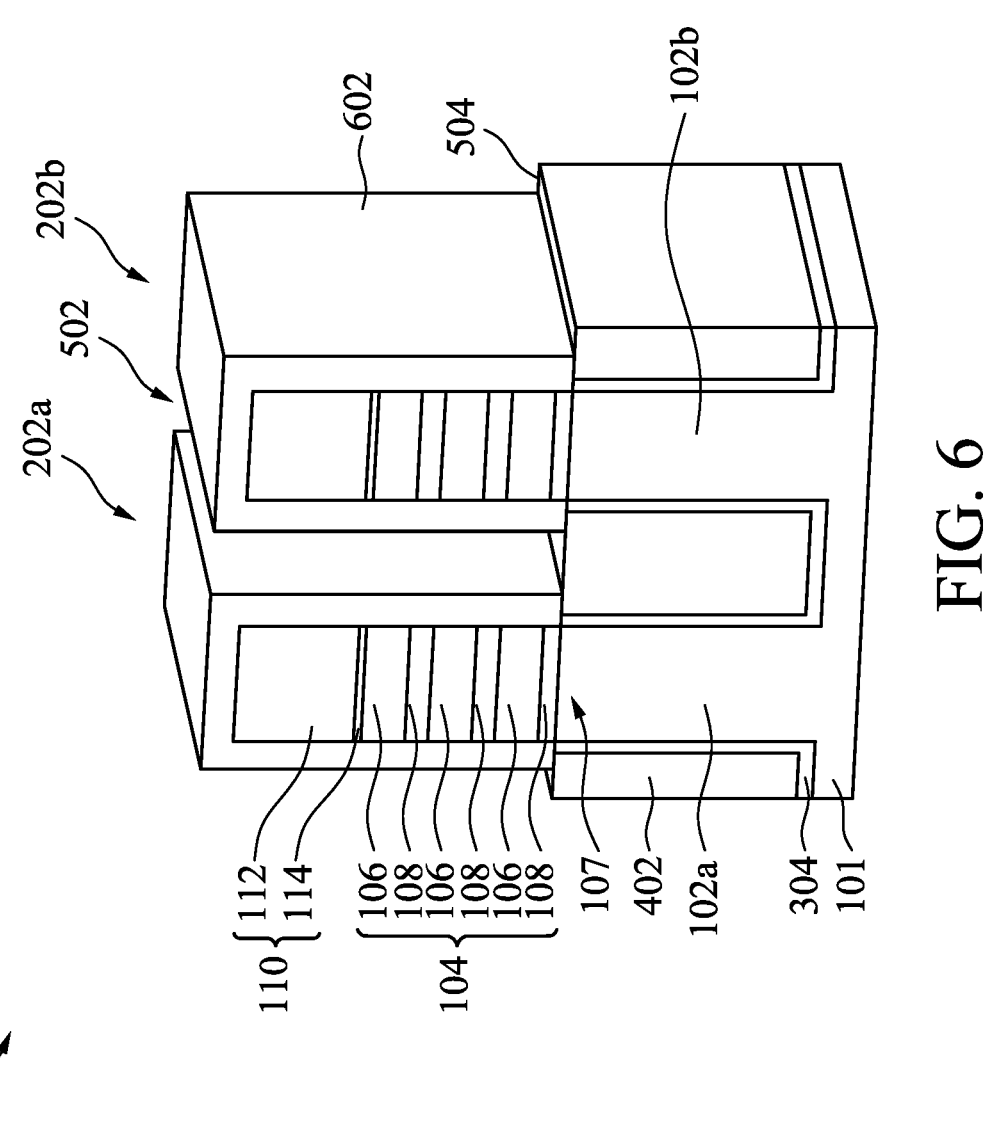

In FIG. 6, a cladding layer 602 is formed on the exposed surface of the liner 304 (FIG. 5). The optional liner 302 is omitted for clarity. The liner 304 may be diffused into the cladding layer 602 during the formation of the cladding layer 602. Thus, in some embodiments where the optional liner 302 does not exist, the cladding layer 602 is in contact with the stack of semiconductor layers 104, as shown in FIG. 6. In some embodiments, the cladding layer 602 includes a semiconductor material. The cladding layer 602 may grow on semiconductor materials but not on dielectric materials. For example, the cladding layer 602 may include SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. In some embodiments, the cladding layer 602 and the second semiconductor layers 108 include the same material having the same etch selectivity. For example, the cladding layer 602 and the second semiconductor layers 108 may both include SiGe. The cladding layer 602 and the second semiconductor layer 108 may be removed subsequently to create space for the gate electrode layer.

Figure 7:
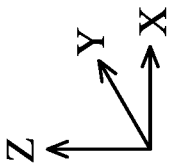
Figure 7:
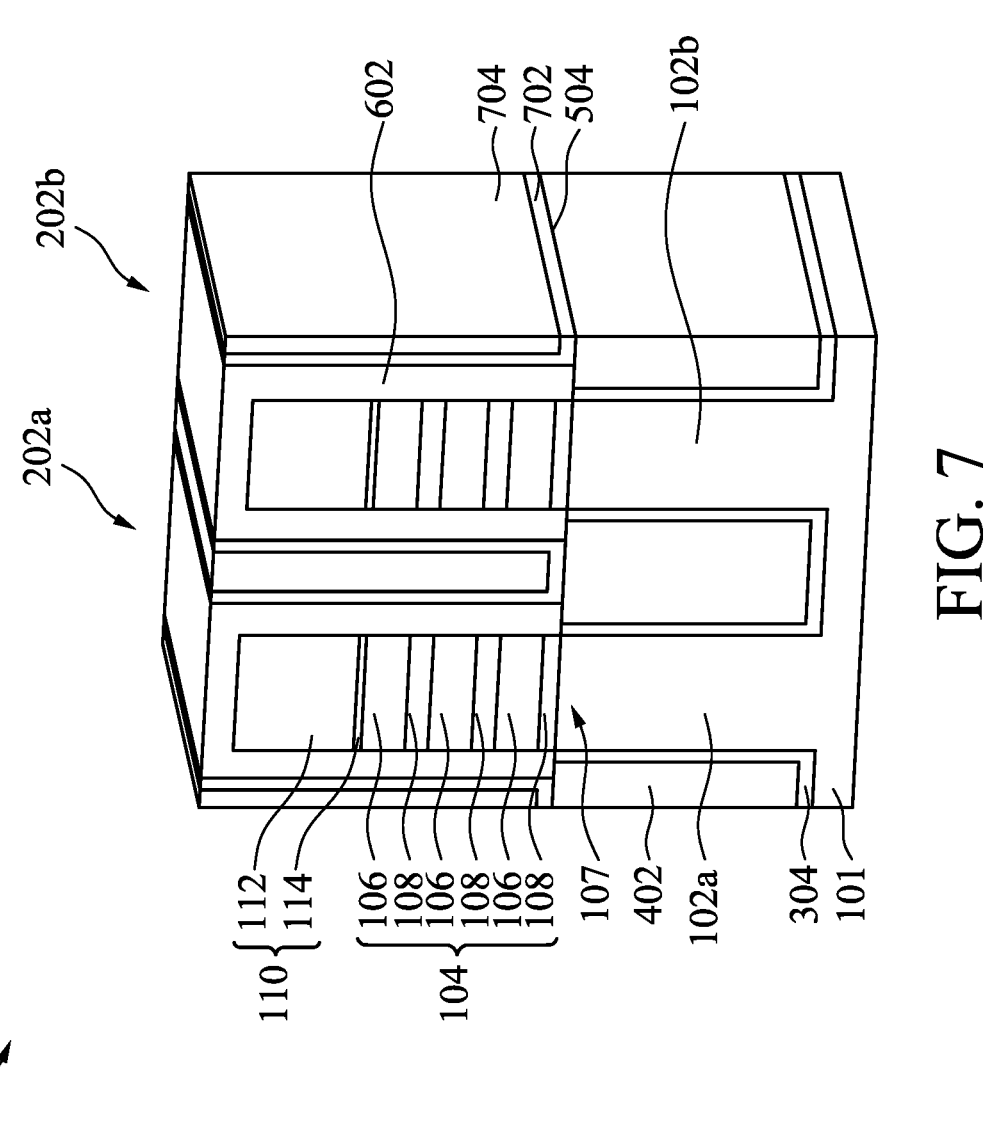

In FIG. 7, a liner 702 is formed on the cladding layer 602 and the top surface 504 of the insulating material 402. The liner 702 may include a low-K dielectric material (e.g., a material having a K value lower than 7), such as $SiO_2$, SiN, SiCN, SiOC, or SiOCN. The liner 702 may be formed by a conformal process, such as an ALD process. The liner 702 may have a thickness ranging from about 1 nm to about 6 nm. The liner 702 may function as a shell to protect a flowable oxide material to be formed in the trenches 502 (FIG. 6) during subsequent removal of the cladding layer 602.

A dielectric core material 704 is then formed in the trenches 502 (FIG. 6) and on the liner 702, as shown in FIG. 7. The liner 702 surrounds and in contact with at least three surfaces of the dielectric core material 704. The dielectric core material 704 may be an oxygen-containing material, such as an oxide, formed by FCVD. (2) The oxygen-containing material may have a K value less than about 7, for example less than about 3. The width of the dielectric core material 704 along the X direction may be defined by the width of the trench 502 and the thickness of the liner 702. In some embodiments, the width of the dielectric core material 704 ranges from about 8 nm to about 30 nm. A planarization process, such as a CMP process, may be performed to remove portions of the liner 702 and the dielectric core material 704 formed over the fins 202*a*, 202*b*. The portion of the cladding layer 602 disposed on the nitrogen-containing layer 114 may be exposed after the planarization process.

Figure 8:
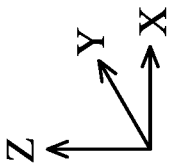
Figure 8:
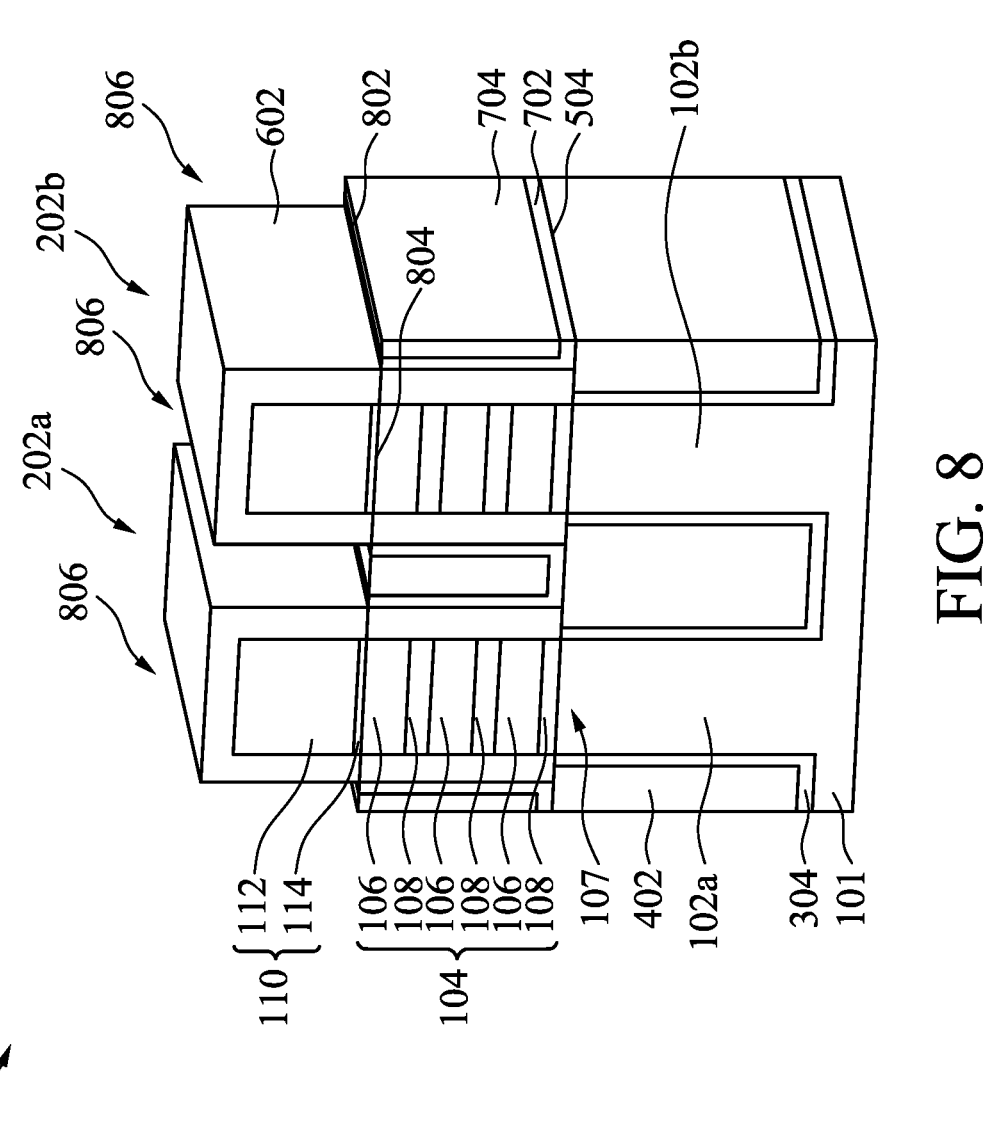

In FIG. 8, portions of the liner 702 and the dielectric core material 704 are recessed to the level of the topmost first semiconductor layer 106. For example, in some embodiments, after the recess process, the dielectric core material 704 may include a top surface 802 that is substantially level with a top surface 804 of the topmost first semiconductor layer 106. The top surface 804 of the topmost first semiconductor layer 106 may be in contact with the mask structure 110, such as in contact with the oxygen-containing layer 112. The liner 702 may be recessed to the same level as the dielectric core material 704. The recess of the liners 702 and the dielectric core material 704 may be performed by any suitable process, such as dry etch, wet etch, or a combination thereof. In some embodiments, a first etch process may be performed to recess the dielectric core material 704 followed by a second etch process to recess the liner 702. The etch processes may be selective etch processes that do not remove the semiconductor material of the cladding layer 602. As a result of the recess process, trenches 806 are formed between the fins 202*a*, 202*b*.

Figure 9:
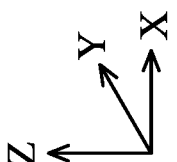
Figure 9:
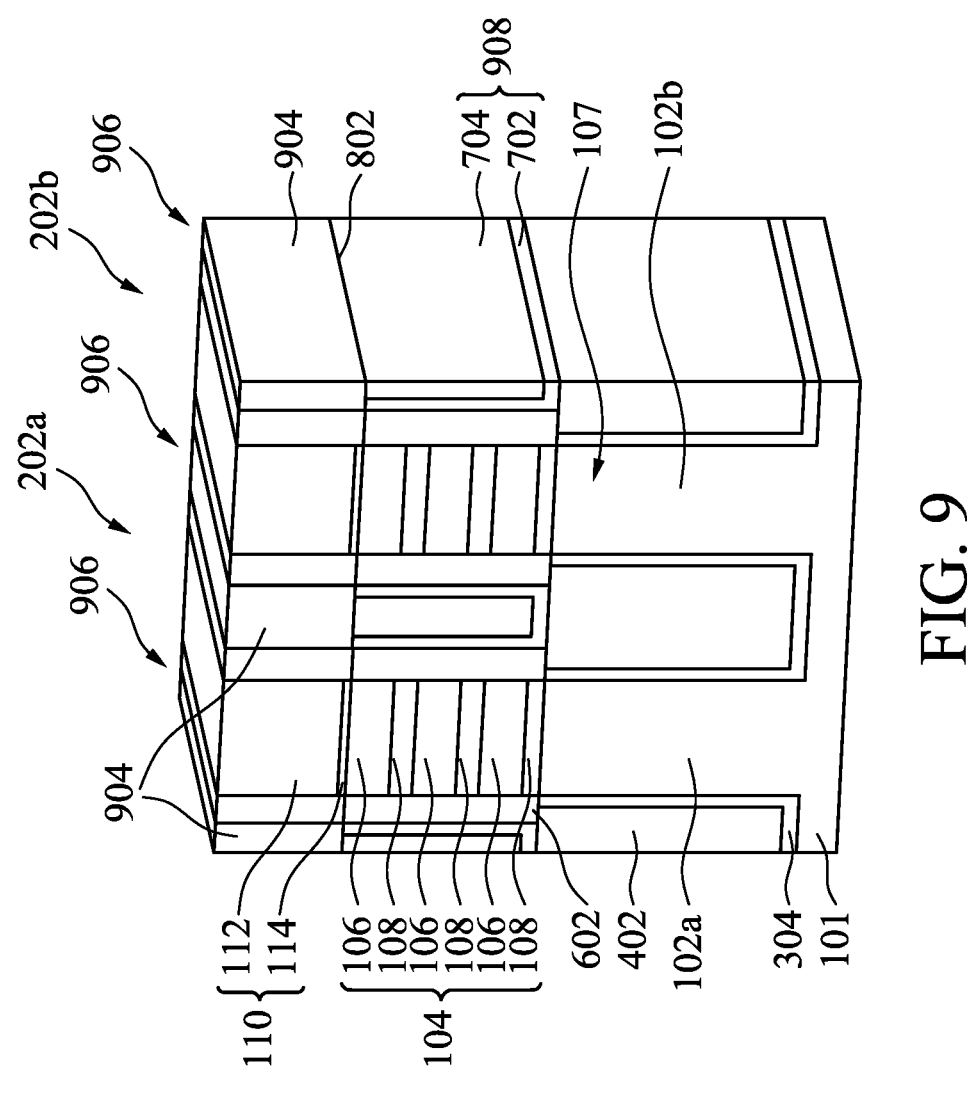
Figure 15:
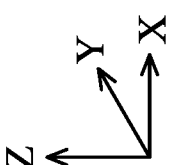

In FIG. 9, a dielectric cap 904 is formed in the trenches 806 (FIG. 8) and on top surfaces of the dielectric core material 704 and the liner 702. The dielectric cap 904 may include SiO, SiN, SiC, SiCN, SiON, SiOCN, AlO, AN, AlON, ZrO, ZrN, ZrAlO, HfO, or other suitable dielectric material. The dielectric cap 904 may be formed by any suitable process, such as a CVD, PECVD, FCVD, or ALD process. The dielectric cap 904 may have a thickness ranging from about 5 nm to about 20 nm. A planarization process (e.g., CMP) is then performed to expose the nitrogen-containing layer 114 of the mask structure 110. The planarization process removes portions of the dielectric cap 904 and the cladding layer 602 disposed over the mask structure 110. The liner 702, the dielectric core material 704, and the dielectric cap 904 together may be referred to as a dielectric feature (or hybrid fin) 906. The dielectric feature 906 includes a bottom portion 908 having a shell, which is the liner 702, and a core, which is the dielectric core material 704. The dielectric feature further includes a top portion, which is the dielectric cap 904. The dielectric feature 906 serves as a dielectric fin that separates adjacent source/drain (S/D) epitaxial features 1502 (FIG. 15).

Figure 10:
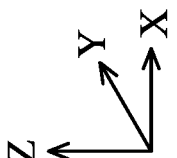
Figure 10:
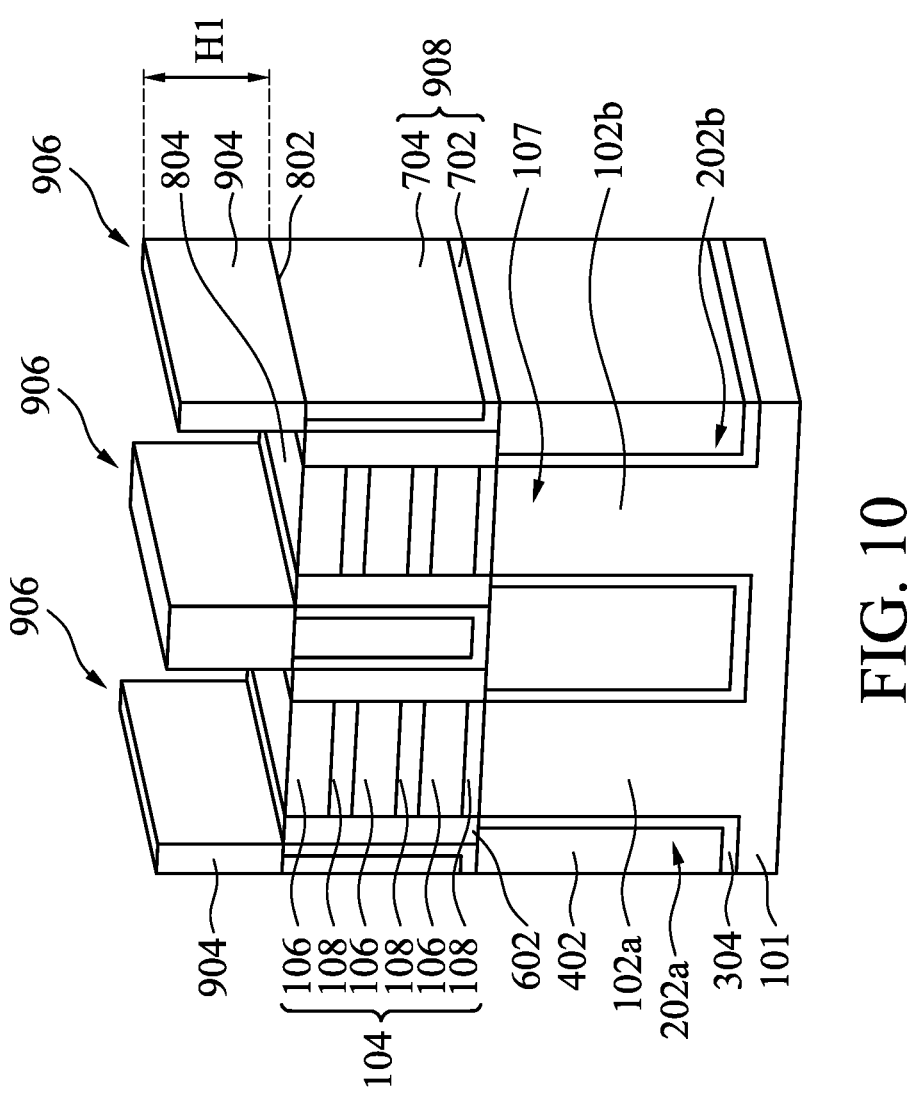

In FIG. 10, portions of the cladding layers 602 are recessed, and the mask structures 110 are removed. The recess of the cladding layers 602 may be performed by any suitable process, such as dry etch, wet etch, or a combination thereof. The recess process may be controlled so that the remaining cladding layers 602 are substantially at the same level as the top surface 804 of the topmost first semiconductor layer 106 in the stack of semiconductor layers 104. The etch process may be a selective etch process that does not remove the dielectric cap 904. The removal of the mask structures 110 may be performed by any suitable process, such as dry etch, wet etch, or a combination thereof. The removal of the mask structure 110 exposes the top surfaces 804 of the topmost first semiconductor layers 106 in the stacks of semiconductor layers 104.

Figures 25A, 25B:
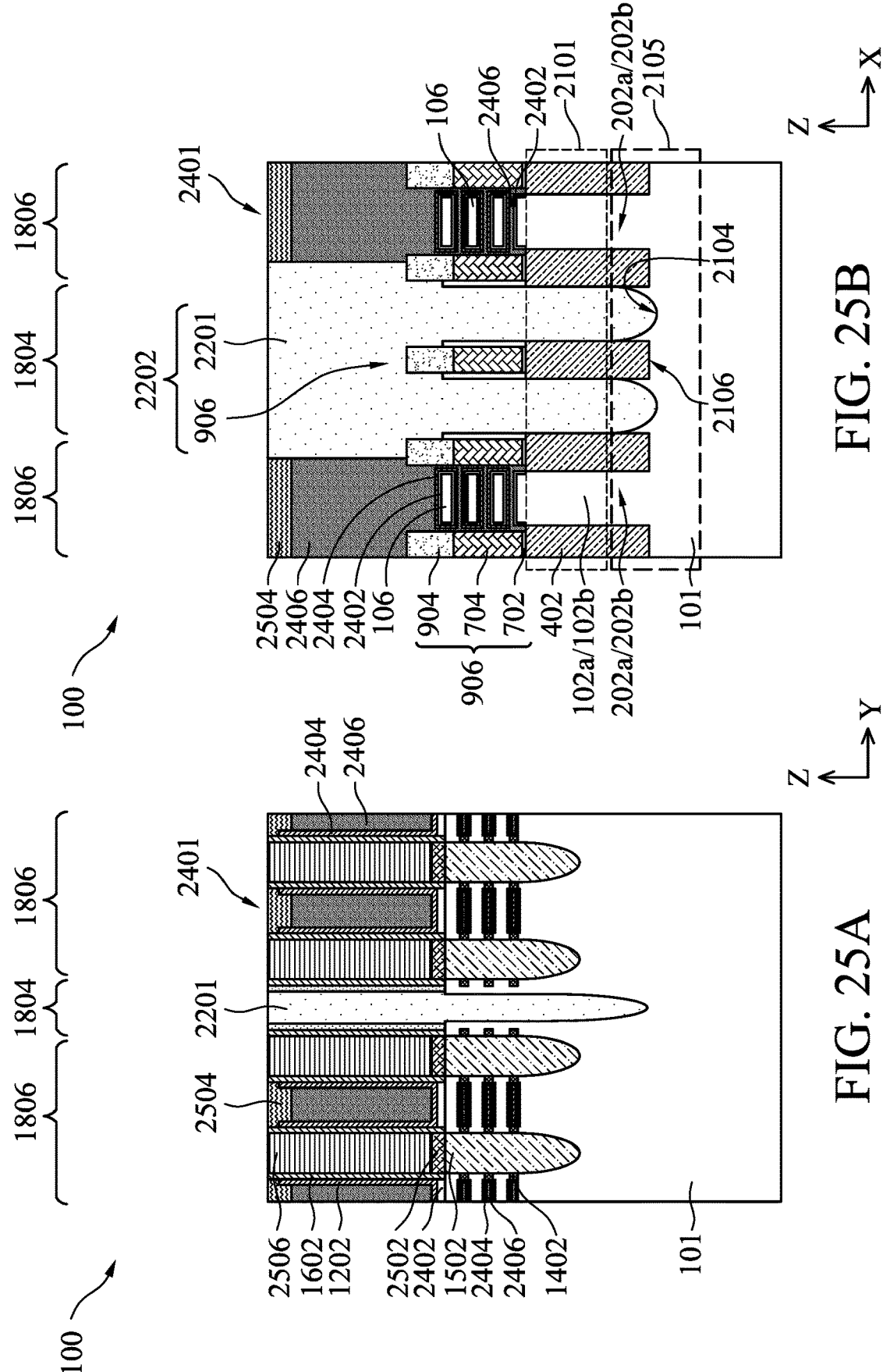

As a result of the removal of the cladding layers 602 and the mask structures 110, the top portion of the dielectric feature 906 (e.g., the dielectric cap 904) may have a height H1 along the Z direction. The height H1 may range from about 6 nm to about 25 nm. The dielectric cap 904 may extend over a plane defined by the top surface 804 by the height H1, in order to separate, or cut-off, adjacent gate electrode layers to be formed subsequently (FIG. 25B).

Figure 11:
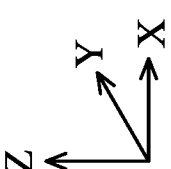

In FIG. 11, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-K dielectric material, and/or other suitable dielectric material. In some embodiments, the sacrificial gate dielectric layer 1104 includes a material different than that of the dielectric cap 904. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 104 of the fins 202a, 202b are partially exposed on opposite sides of the sacrificial gate stack 1102. While two sacrificial gate stacks 1102 are shown in FIG. 11, the number of the sacrificial gate stacks 1102 is not limited to two. More than two sacrificial gate stacks 1102 may be arranged along the Y direction in some embodiments.

Figure 12:
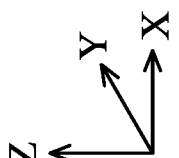

In FIG. 12, a spacer 1202 is formed on the sidewalls of the sacrificial gate stacks 1102. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202a, 202b, the cladding layer 602, the dielectric cap 904, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Next, exposed portions of the fins 202a, 202b, exposed portions of the cladding layers 602, exposed portions of the dielectric cap 904 not covered by the sacrificial gate stacks 1102 and the spacers 1202 are selectively recessed by using one or more suitable etch processes, such as dry etch, wet etch, or a combination thereof. In some embodiments, exposed portions of the stacks of semiconductor layers 104 of the fins 202a, 202b are removed, exposing portions of the substrate portions 102a, 102b, respectively. As shown in FIG. 12, the exposed portions of the fins 202a, 202b are recessed to a level at or below the top surface 504 (FIG. 6) of the insulating material 402. The recess processes may include an etch process that recesses the exposed portions of the fins 202a, 202b and the exposed portions of the cladding layers 602.

In some embodiments, the etch process may reduce the height of the exposed top portion (e.g., the dielectric cap 904) of the dielectric feature 906 from H1 to H2, as shown in FIG. 12. Thus, a first portion 1204 of the dielectric cap 904 under the sacrificial gate stack 1102 and the spacers 1202 has the height H1, while a second portion 1206 of the dielectric cap 904 located between S/D epitaxial features 1502 (FIG. 15) has the height H2 less than the height H1.

At this stage, end portions of the stacks of semiconductor layers 104 under the sacrificial gate stacks 1102 and the spacers 1202 have substantially flat surfaces which may be flush with corresponding spacers 1202. In some embodiments, the end portions of the stacks of semiconductor layers 104 under the sacrificial gate stacks 1102 and spacers 1202 are slightly horizontally etched.

Figure 13:
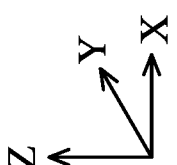

In FIG. 13, the edge portions of each second semiconductor layer 108 and edge portions of the cladding layers 602 are removed, forming gaps 1302. In some embodiments, the portions of the semiconductor layers 108 and cladding layers 602 are removed by a selective wet etch process that does not remove the first semiconductor layers 106. For example, in cases where the second semiconductor layers 108 are made of SiGe, and the first semiconductor layers 106 are made of silicon, a selective wet etch including an ammonia and hydrogen peroxide mixtures (APM) may be used.

Figure 14:
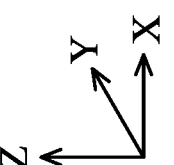

In FIG. 14, dielectric spacers 1402 are formed in the gaps 1302 (FIG. 13). In some embodiments, the dielectric spacers 1402 may be made of a low-K dielectric material, such as SiON, SiCN, SiOC, SiOCN, or SiN. In some embodiments, the dielectric spacers 1402 may be formed by first forming a conformal dielectric layer using a conformal deposition process, such as ALD, followed by an anisotropic etch to remove portions of the conformal dielectric layer other than the dielectric spacers 1402. The dielectric spacers 1402 may be protected by the first semiconductor layers 106 and the spacers 1202 during the anisotropic etch process. In some embodiments, the dielectric spacers 1402 may be flush with the spacers 1202 along the Z direction.

In FIG. 15, S/D epitaxial features 1502 are formed on the substrate portions 102a, 102b of the fins 202a, 202b. The S/D epitaxial feature 1502 may include one or more layers of Si, SiP, SiC and SiCP for an n-type FET or Si, SiGe, Ge for a p-type FET. The S/D epitaxial features 1502 may grow both vertically and horizontally from the substrate portions 102a, 102b to form facets, which may correspond to crystalline planes of the material used for the substrate portions 102a, 102b. The S/D epitaxial features 1502 may be formed by an epitaxial growth method using CVD, ALD or MBE. Once formed, the S/D epitaxial features 1502 are in contact with the first semiconductor layers 106 and dielectric spacers 1402 (FIG. 14). The S/D epitaxial features 1502 may represent the S/D regions. For example, one of a pair of S/D epitaxial features 1502 located on one side of the sacrificial gate stacks 1102 may be a source region, and the other of the pair of S/D epitaxial features 1502 located on the other side of the sacrificial gate stacks 1102 may be a drain region. A pair of S/D epitaxial features 1502 includes a source epitaxial feature 1502 and a drain epitaxial feature 1502 connected by the channels (i.e., the first semiconductor layers 106). In this disclosure, a source and a drain are interchangeably used, and the structures thereof are substantially the same.

Figure 16:
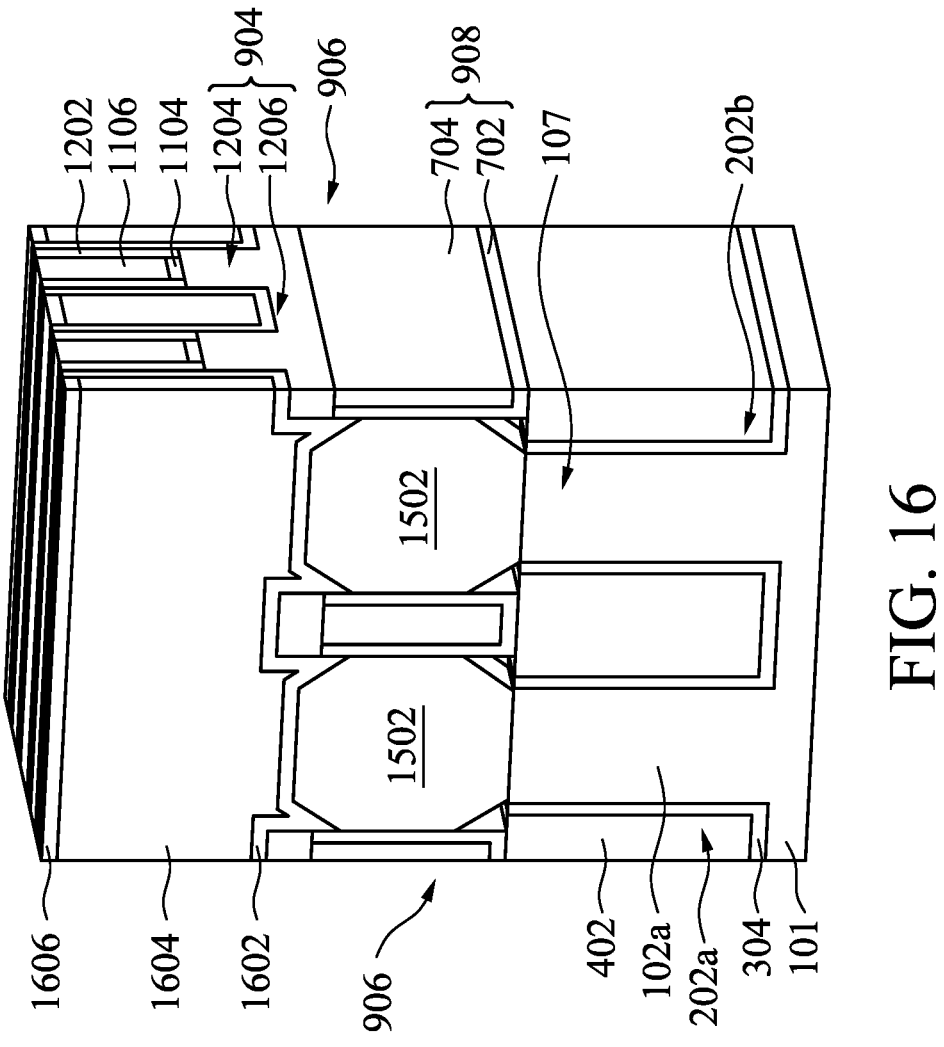

In FIG. 16, a contact etch stop layer (CESL) 1602 may be formed on the S/D epitaxial features 1502, the dielectric features 906, and adjacent the spacers 1202. The CESL 1602 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 1602 may be formed by CVD, PECVD, ALD, or any suitable deposition technique. In some embodiments, the CESL 1602 is a conformal layer formed by the ALD process.

Next, an interlayer dielectric (ILD) layer 1604 is formed on the CESL 1602. The materials for the ILD layer 1604 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1604 may be deposited by a PECVD process or other suitable deposition technique. In some embodiments, after formation of the ILD layer 1604, the semiconductor device structure 100 may be subject to a thermal process to anneal the ILD layer 1604. Thereafter, a planarization process (e.g., CMP) is performed to expose the sacrificial gate electrode layer 1106, as shown in FIG. 16. The planarization process removes portions of the ILD layer 1604 and the CESL 1602 disposed on the sacrificial gate stacks 1102. The planarization process may also remove the mask structure 1108 (FIG. 15). The ILD layer 1604 may be recessed to a level below the top of the sacrificial gate electrode layer 1106, and a nitrogen-containing layer 1606, such as a SiN, SiCN, or TiN layer, may be formed on the recessed ILD layer 1604, as shown in FIG. 16. The nitrogen-containing layer 1606 may protect the ILD layer 1604 during subsequent etch processes. After the planarization process, the top surfaces of the nitrogen-containing layer 1606, the CESL 1602, the spacers 1202, and the gate electrode layer 1106 may be co-planar.

Figure 17:
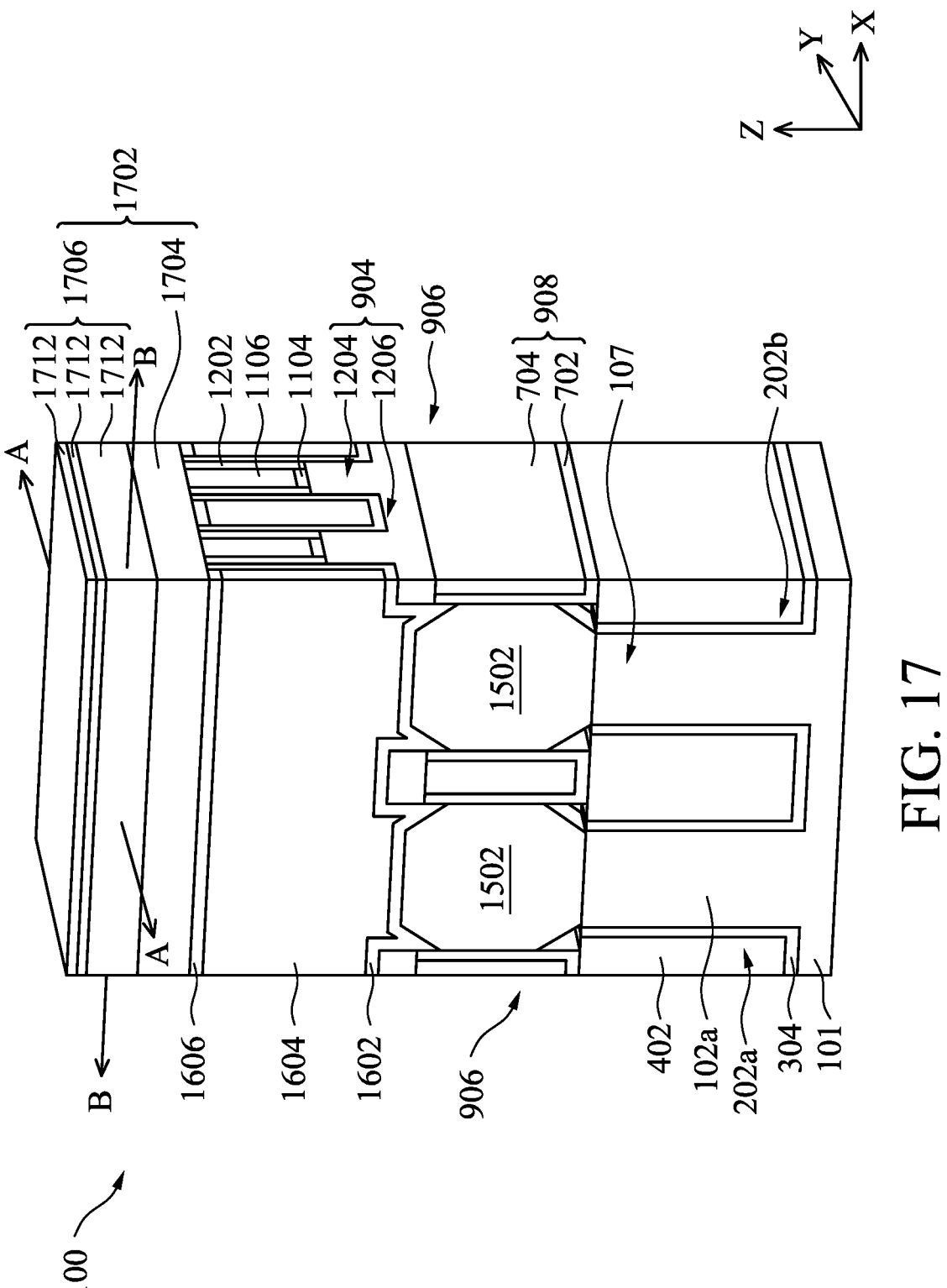

In FIG. 17, a mask structure 1702 is formed on the top surfaces of the nitrogen-containing layer 1606, the CESL 1602, the spacers 1202, and the gate electrode layer 1106. The mask structure 1702 may include a mask layer 1704 and a resist layer 1706. The mask layer 1704 may be any suitable masking material. In some embodiments, the mask layer 1704 is formed of the same material as the nitrogen-containing layer 1606. The resist layer 1706 may be a single layer photoresist or a tri-layer photoresist. An exemplary tri-layer photoresist may include a bottom layer 1708, a middle layer 1710 disposed over the bottom layer 1708, and a photosensitive top layer 1712 disposed over the middle layer 1710. The bottom layer 1710 may be a bottom anti-reflective coating (BARC) layer, the middle layer 1710 may be a silicon-containing inorganic polymer that provides anti-reflective properties and/or hard mask properties for a photolithography process, and the photosensitive top layer 1712 may be a DUV resist (KrF) resist, an argon fluoride (ArF) resist, an EUV resist, an electron beam (e-beam) resist, or an ion beam resist.

Figures 18A, 18B:
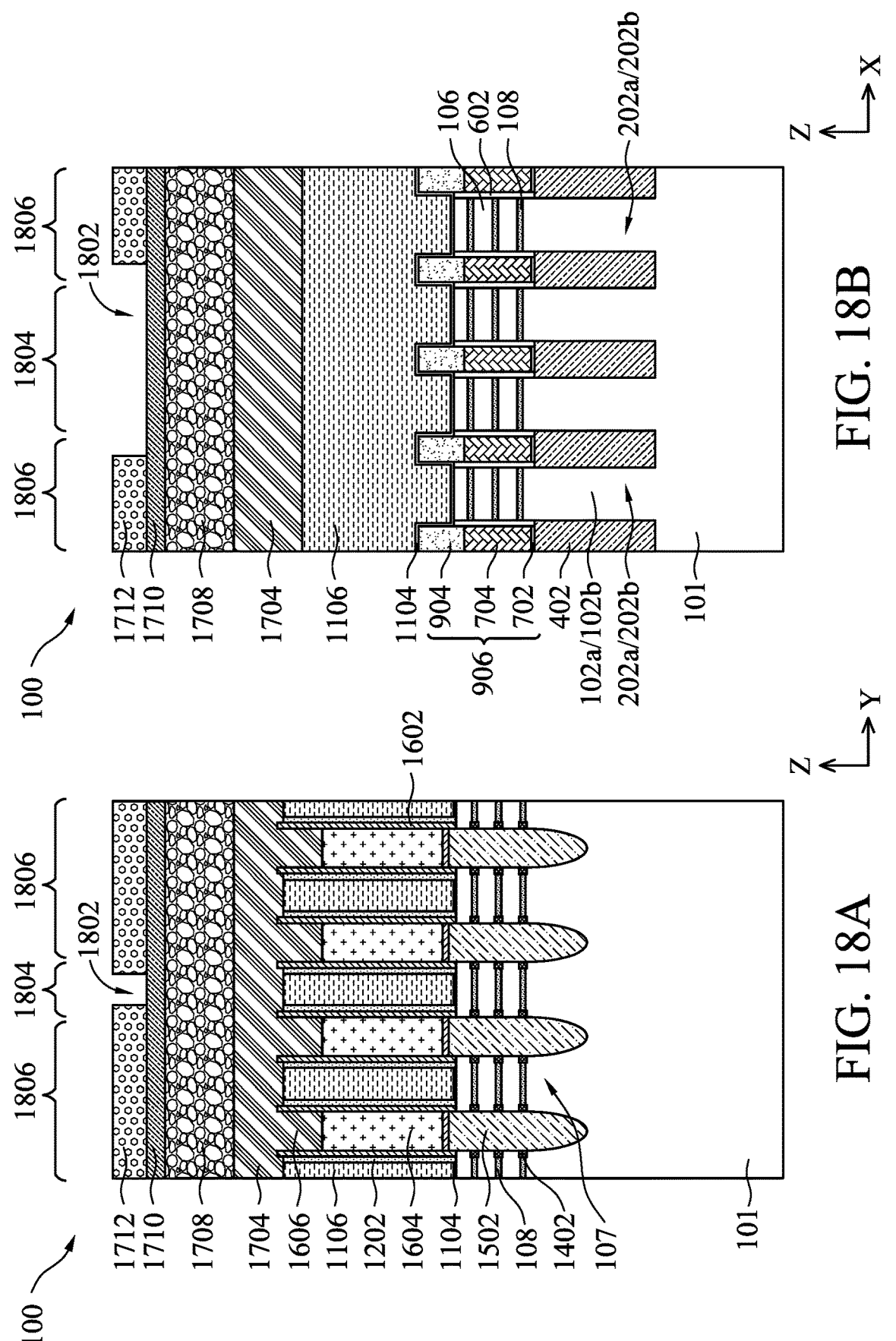
FIGS. 18A-18B to 25A-25B are cross-sectional side views of one of various stages of manufacturing the semiconductor device structure taken along lines A-A and B-B of FIG. 17, respectively, in accordance with some embodiments.

FIGS. 18A-18B to 25A-25B are cross-sectional side views of one of various stages of manufacturing the semiconductor device structure 100 taken along lines A-A and B-B of FIG. 17, respectively, in accordance with some embodiments. The line A-A is in a plane of a fin (e.g., fin 202*a*) along the Y direction. The line B-B is in a plane perpendicular to line A-A and is in the sacrificial gate electrode layer 1106 along the X direction. In various embodiments shown in FIGS. 18A-18B to 25A-25B, multiple fins or sacrificial gate stacks 1102 are shown along the X and Y directions, respectively. In FIGS. 18A and 18B, the photosensitive top layer 1712 is patterned to form openings 1802. For ease of illustration, only one opening 1802 is shown. The patterned photosensitive top layer 1712 is used as a mask during a subsequent process, such as one or more photolithographic processes, to transfer the pattern (i.e., openings 1802) in the photosensitive top layer 1712 into the middle layer 1710, the bottom layer 1708, and the mask layer 1704.

The openings 1802 define an isolation region 1804 to be formed in the substrate portions 102*a*, 102*b* of the fins 202*a*, 202*b*. The isolation region 1804 may be disposed between neighboring active regions 1806. Alternatively or stated differently, the active regions 1806 may be disposed between isolation regions 1804. The term "active region" refers to a region where transistors are formed. As will be discussed in more detail below, the isolation regions 1804 may be formed by performing a fin-cut (or sheet-cut) process and filling the fin-cut (or sheet-cut) regions with a dielectric. This fin-cut (or sheet-cut) process may be referred to continuous poly on diffusion edge (CPODE) process. The term "diffusion edge" is equivalently referred to as an active edge, which is an edge abutting adjacent active regions. The CPODE process can be used to reduce gate pitch, thereby increasing the density for multi-gate devices and thus device performance required for aggressively scaled circuits and devices. In any case, the openings 1802 are arranged at locations where a portion of the sacrificial gate stacks 1102 may be revealed in a later stage. In some embodiments, each of the openings 1802 may extend to overlap a single sacrificial gate stack 1102. In some embodiments, each of the openings 1802 may extend to overlap a plurality of sacrificial gate stacks 1102 along the Y direction.

Figures 19A, 19B:
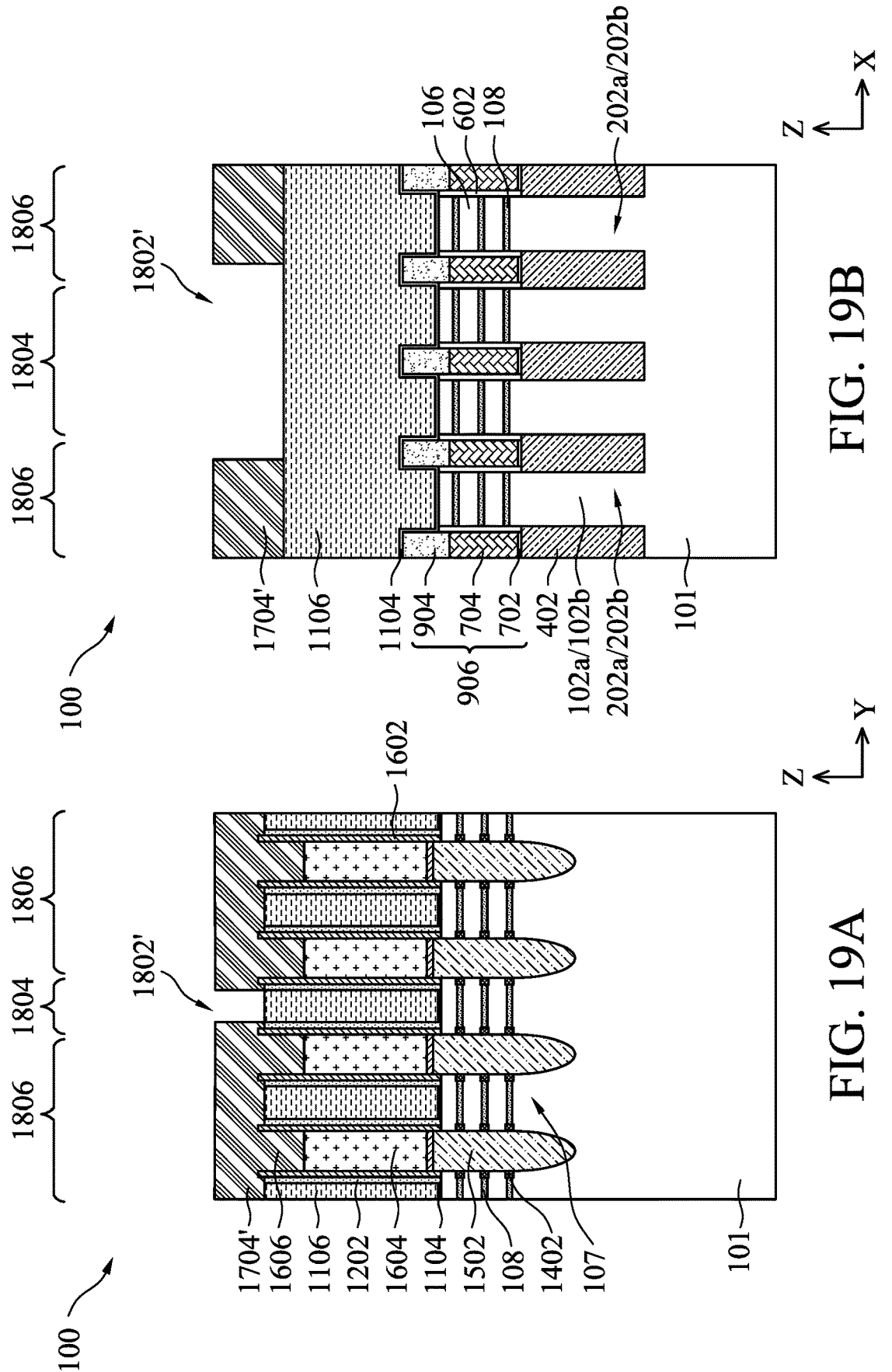

In FIGS. 19A and 19B, the patterns (i.e., openings 1802) in the photosensitive top layer 1712 are transferred to the mask layer 1704 to form patterned mask layer 1704', and the bottom layer 1708, the middle layer 1710, the photosensitive top layer 1712 are removed. The formation of the patterned mask layer 1704' may be achieved by one or more photolithographic processes. As a result of the one or more photolithographic processes, openings 1802' are formed in the patterned mask layer 1704', and a portion of the sacrificial gate electrode layer 1106 is exposed. The patterned mask layer 1704' may then be used to protect active regions 1806 during subsequent removal of the exposed sacrificial gate stacks 1102 and fin-cut (or sheet-cut) process.

Figures 20A, 20B:
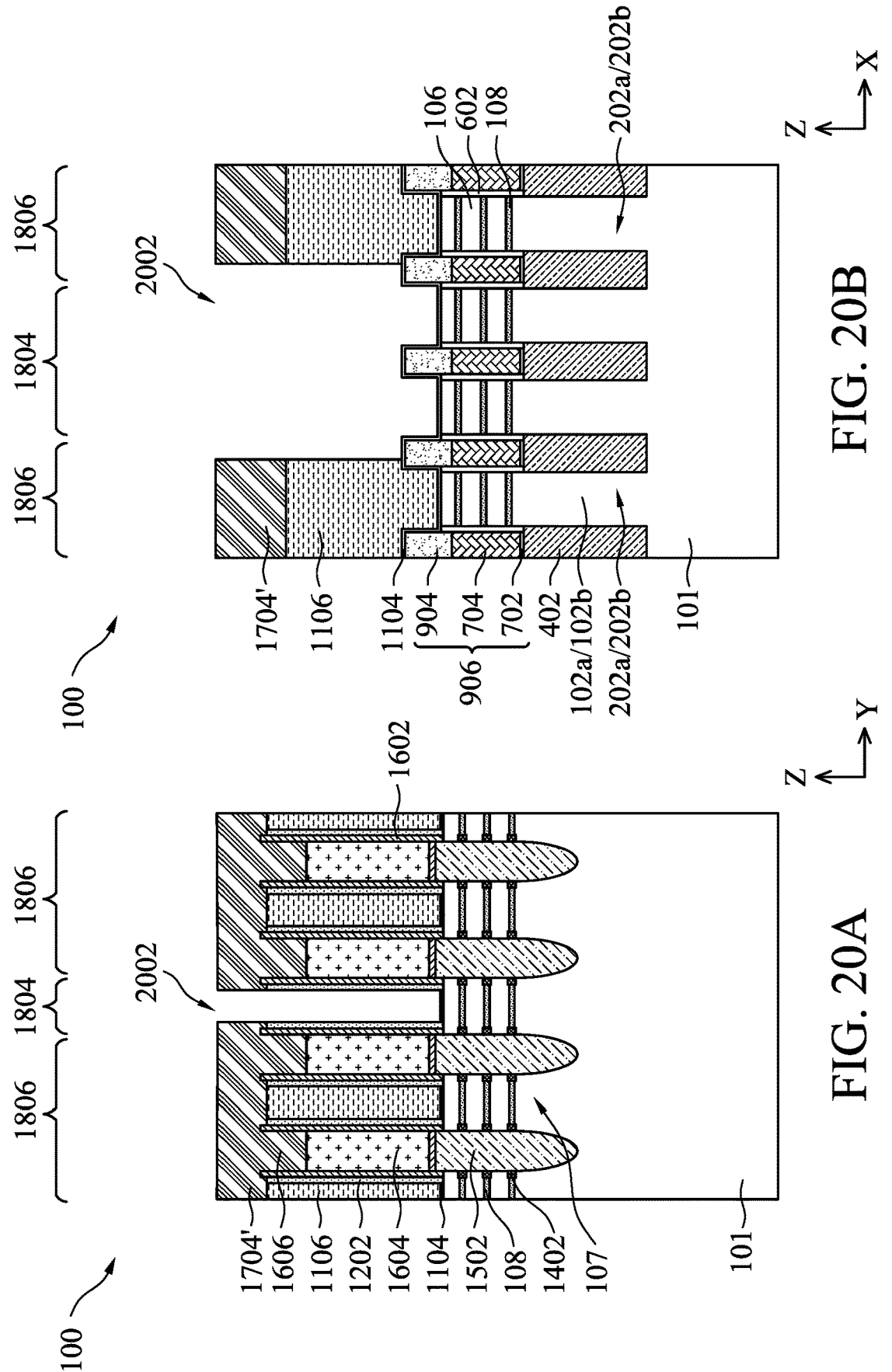

In FIGS. 20A and 20B, the exposed sacrificial gate stacks 1102 are selectively removed to form openings 2002. The openings 2002 expose the sacrificial gate dielectric layer 1104 within the isolation regions 1804. The sacrificial gate stacks 1102 in the active regions 1806 are protected by the patterned mask layer 1704'. The removal of the exposed sacrificial gate stacks 1102 may be performed using any suitable etch back process. The etch back process may be a selective etch process that removes the sacrificial gate stacks 1102 but does not remove the spacers 1202 and the sacrificial gate dielectric layer 1104. In some embodiments, the sacrificial gate dielectric layer 1104 may also be removed.

Figures 21A, 21B:
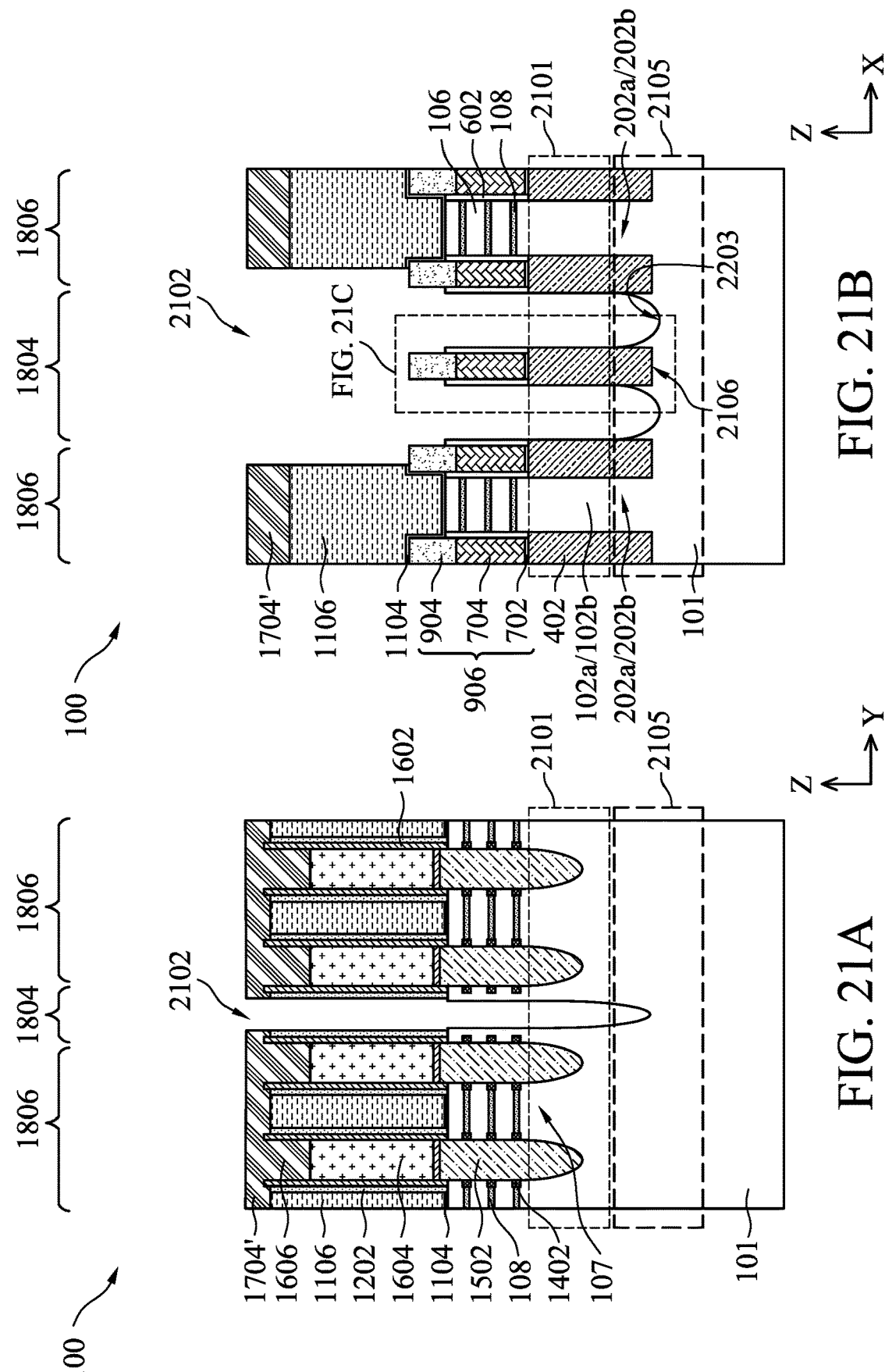
FIG. 21C illustrates an enlarged view of a portion of the semiconductor device structure of FIG. 21B showing the insulating material at the isolation region after a fin-cut (or sheet-cut) process.
Figures 22A, 22B:
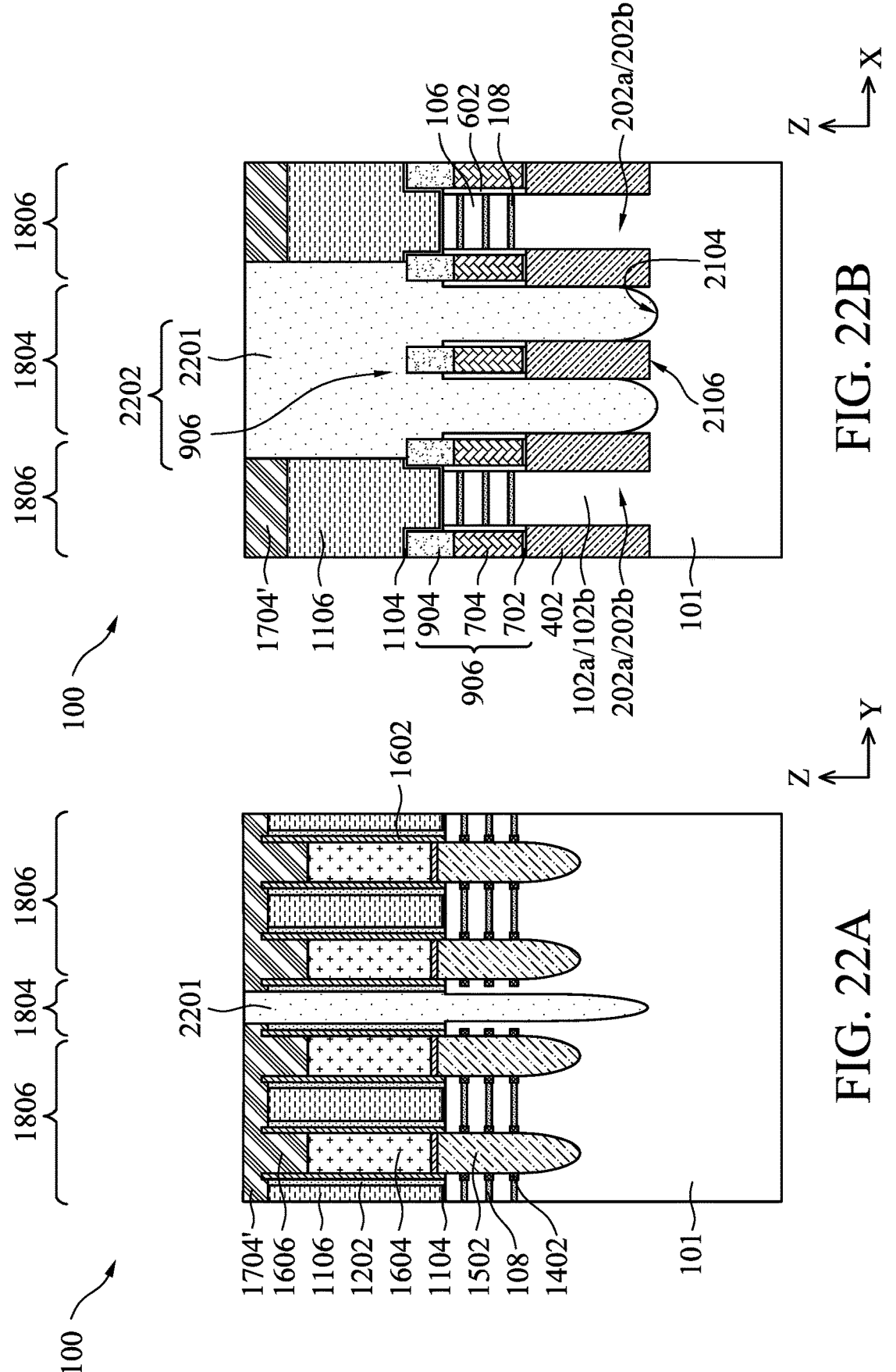

In FIGS. 21A and 21B, a fin-cut (or sheet-cut) process is performed to remove the exposed sacrificial gate dielectric layer 1104, the first semiconductor layers 106, and the second semiconductor layers 108 at the isolation regions 1804. The fin-cut (or sheet-cut) process is performed using the patterned mask layer 1704' as an etching mask. The fin-cut (or sheet-cut) process may be dry etch, reactive ion etch (RIE), and/or other suitable processes. The fin-cut (or sheet-cut) process is performed so that the exposed sacrificial gate dielectric layer 1104, the first semiconductor layers 106, and the second semiconductor layers 108 are selectively removed, while the dielectric feature 906 remains substantially intact. In some embodiments where RIE is used to perform the fin-cut process, the dielectric cap 904 may be partially removed due to physical bombardment as a result of bias power-on etch processes. As a result of the removal of the first semiconductor layers 106 and the second semiconductor layers 108, openings 2102 are formed in the substrate portions 102a, 102b of the fins 202a, 202b (at the isolation region 1804) between two neighboring active regions 1806. The openings 2102 are to be filled with a dielectric material and form isolation structures 2202 (FIGS. 22A and 22B). As will be discussed in more detail below, the isolation structures 2202 can block the path of current leakage in the well portion 107 between neighboring transistors at the active regions 1806.

In some embodiments, prior to the fin-cut process, the patterned mask layer 1704' is optionally exposed to a gas mixture comprising $CH_4$ and a dilute gas (e.g., Ar and/or $N_2$) to form a protection layer (not shown) on the patterned mask layer 1704'. The protection layer prevents or minimize the patterned mask layer 1704' from being damaged during the subsequent etch processes. In such cases, an etch process using etch chemistries comprising $CF_4$ and argon may be used to break through the protection layer so that the fin-cut process can be performed.

In various embodiments, the fin-cut process is performed such that the bottom 2104 of the openings 2102 is at a level lower than the bottom surface 2106 of the insulating material 402 (i.e., STI). Particularly, the substrate portions 102a, 102b of the fins 202a, 202b at the isolation region 1804 are recessed so that only portions of the substrate portion 102a, 102b (e.g., silicon) remains at the bottom sidewall of the insulating material 402. In some embodiments, the fin-cut (or sheet-cut) process is performed so that a lateral recess is occurred on the upper sidewall of the insulating material 402. The lateral recess of the insulating material 402 ensures fully removal of the substrate portions 102a, 102b at the upper sidewall of the insulating material 402, while creating greater room for etchant chemicals to travel within the openings 2102 and remove the substrate portions 102a, 102b on the insulating material 402 between the upper sidewall and bottom sidewall of the insulating material 402. As a result, there is only a small portion of the substrate portion 102a, 102b remains at or near the bottom sidewall of the insulating material 402.

Figure 21C:
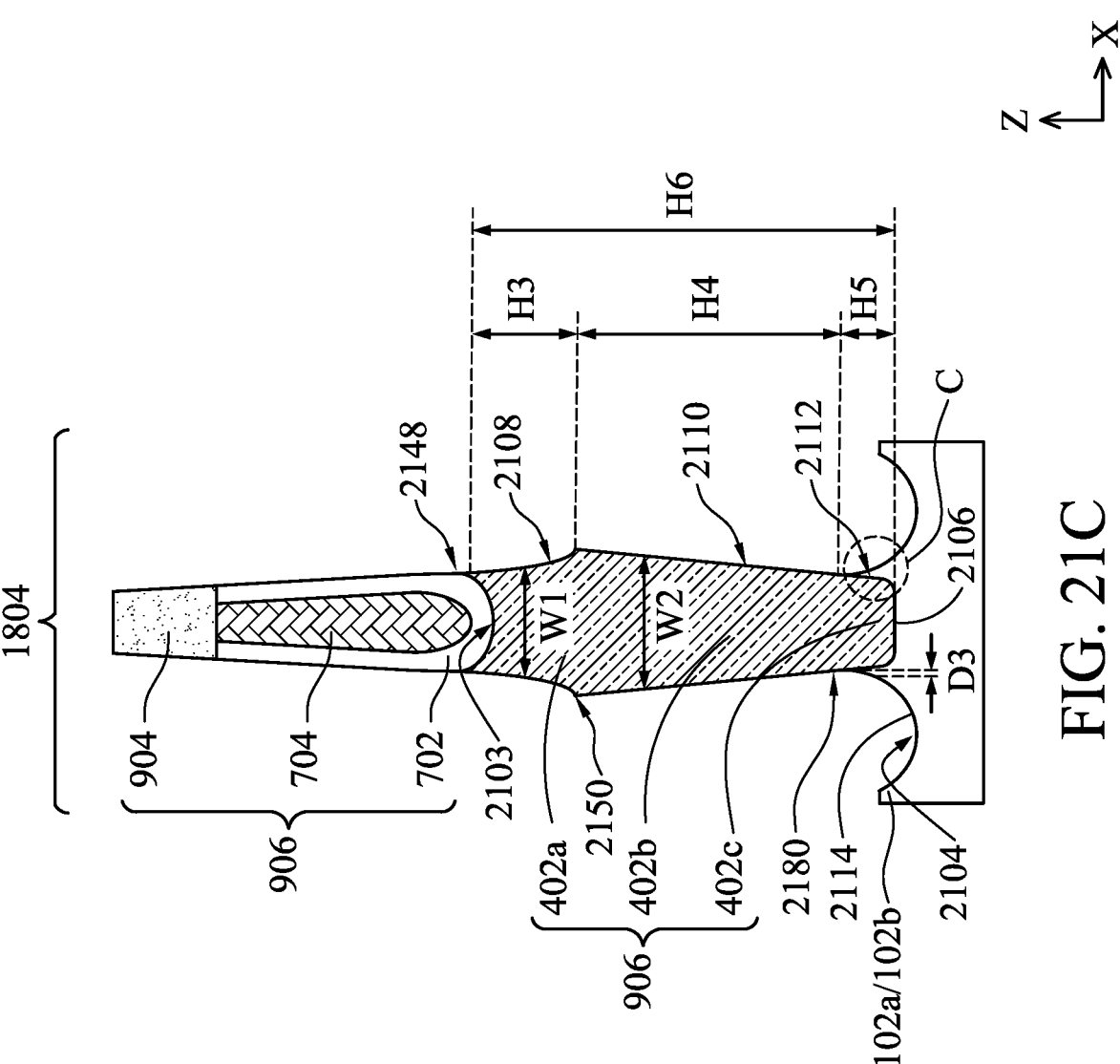

FIG. 21C illustrates an enlarged view of a portion of the semiconductor device structure 100 showing the insulating material 402 at the isolation region after the fin-cut (or sheet-cut) process. The insulating material 402 is shown to have an upper portion 402a adjacent the dielectric feature 906, a bottom portion 402c extended a depth into and in contact with the substrate portion 102a, 102b, and a middle portion 402b disposed between the upper portion 402a and the bottom portion 402c. The upper portion 402a has a top surface 2103 in contact with the bottom of the liner 702 of the dielectric feature 906. In some embodiments, the top surface 2103 has a concave profile.

The upper portion 402a, the middle portion 402b, and/or the bottom portion 402c may have a curved surface profile. In some embodiments, the bottom portion 402c has a sidewall 2112 that may be formed with a first radius ($R_\theta$) of curvature R1. The upper portion 402a has a sidewall 2108 that may be formed with a second radius ($R_\theta$) of curvature R2 that is greater than the first radius of curvature R1. The middle portion 402b of the insulating material 402 has a sidewall 2110 that may be formed substantially flat. As can be seen, the sidewall 2108 of the upper portion 402a and the sidewall 2110 of the middle portion 402b at the isolation region 1804 are free from the substrate portion 102a, 102b, and the sidewall 2112 of the bottom portion 402c is surrounded by and in contact with the substrate portion 102a, 102b. The sidewalls 2108, 2110 are to be in contact with the dielectric material 2201 of the isolation structure 2202 (FIG. 22B).

In some embodiments, the upper portion 402a of the insulating material 402 may have a width W1 gradually increasing from the side adjacent the dielectric feature 906 towards the side adjacent the middle portion 402b. In one example, the width W1 of the upper portion 402a is gradually increased along a direction away from the top surface 2103 of the upper portion 402a. In some embodiments, the middle portion 402b may have a width W2 gradually decreasing from the side adjacent the upper portion 402a towards the side adjacent the substrate portion 102a, 102b. In one example, the width W2 of the middle portion 402b is gradually decreased along a direction away from the dielectric feature 906.

In some embodiments, the upper portion 402a has a height H3, the middle portion 402b has a height H4 that is greater than the height H3, and the bottom portion 402c has a height H5 that is smaller than the height H3. The height H3 is measured from a highest point 2148 of the insulating material 402 to a point 2150 where the sidewall 2108 of the upper portion 402a and sidewall 2110 of the middle portion 402b meet. Here, the highest point 2148 of the insulating material 402 refers to a highest point of an "un-etched" insulating material 402, which may be defined by an interface between the insulating material 402 and the liner 702 (FIG. 17). The height H5 is measured from a highest point 2180 of the substrate portion 102a, 102b meeting the insulating material 402 to the bottom surface 2106 of the insulating material 402. Stated differently, a portion (e.g., bottom portion 402c) of the insulating material 402 is at a depth in the substrate portion 102a, 102b, and the depth may correspond to the height H5 in some embodiments. In some embodiments, the height H5 may be measured from a point where the substrate portion 102a, 102b has a thickness or lateral diameter D3 of about 1.5 nm on the sidewall 2112 of the bottom portion 402c to the bottom surface 2106 of the insulating material 402. The height H4 is measured from the point 2150 to the highest point 2180 of the substrate portion 102a, 102b meeting the insulating material 402.

In some embodiments, the height H3 may be in a range of about 20 nm to about 40 nm, for example about 30 nm, and the height H5 may be in a range of about 5 nm to about 10 nm, for example about 6 nm. The insulating material 402 has a height H6 that is measuring from a highest point where the insulating material meets the dielectric feature 906 (e.g., liner 702) to the bottom surface 2106 of the insulating material 402. In various embodiments, the height H3 and the height H4 may be at a ratio (H3:H4) of about 1:1.5 to about 1:2.5, for example about 1:2. In various embodiments, the height H5 and the height H6 may be at a ratio (H5:H6) of about 1:10 to about 1:20, for example about 1:15 to about 1:18. If the ratio (H5:H6) is less than about 1:10, the substrate portion 102a, 102b may cover the sidewall 2110 of the middle portion 402b (or even the sidewall 2108 of the upper portion 402a) and unfavorably form a leakage current path in a subsequent depletion region 2101 (a conductive region located at/near the well portion 107 of the substrate 101, FIG. 25B) due to the diffusion of charge carriers from the S/D epitaxial feature 1502 to the substrate portion 102a, 102b. On the other hand, if the ratio (H5:H6) is greater than about 1:20, the etchant amount used may be increased, which increases the risk of EPI damage.

In various embodiments, the fin-cut (or sheet-cut) process includes a first etch scheme and a second etch scheme. The first etch scheme may be a plasma-based etch process employing one or more etchants that selectively remove the first and second semiconductor layers 106, 108 (and portions of the mask layer 1704') but do not substantially remove the dielectric feature 906 and the sacrificial gate electrode layer 1106. In some embodiments, the first etch scheme may continue until the openings 2102 reach a depth defined by the top surface of the insulating material 402. Additionally or alternatively, the first etch scheme may continue until a sidewall of the insulating material 402 (e.g., the sidewall 2108 of the upper portion 402a) is exposed.

Once the openings 2102 reach the desired depth needed for the first etch scheme, the second etch scheme is then performed to extend the openings 2102 through the depletion region 2101 and into a desired depth in an accumulation region 2105. Here, the accumulation region 2105 refers to a non-conductive region in the substrate portions 102a, 102b and below the depletion region 2101, as shown in FIGS. 21A and 21B. In some embodiments, the second etch scheme is performed so that the height H5 of the bottom portion 402c of the insulating material 402 is about 10 nm or below. The second etch scheme may be a dry etch process employing one or more etchants that selectively remove the substrate portions 102a, 102b and a portion of the insulating material 402 but do not substantially remove the dielectric feature 906 and the sacrificial gate electrode layer 1106. The etchant used in the first etch scheme may be a chlorine-based etch chemistry, a bromine-based chemistry, or a chlorine/bromine-based etch chemistry. Chlorine-based etch chemistry is effective in removing the dielectric cap 904. The etchant used in the second etch scheme may be a fluorine-based etch chemistry, a chlorine-based etch chemistry, a bromine-based etch chemistry, a fluorine/chlorine-based etch chemistry, a fluorine/bromine-based etch chemistry, a chlorine/bromine-based etch chemistry, or any combination thereof. In one exemplary embodiment, the first etch scheme employs a bromine-based etch chemistry and the second etch scheme employs a fluorine-based etch chemistry and a bromine-based etch chemistry, or vice versa. In another exemplary embodiment, the first etch scheme employs a bromine-based etch chemistry and the second etch scheme employs a bromine-based etch chemistry. Exemplary chlorine-based etch chemistry may include, but are not limited to, $Cl_2$, $CHCl_3$, $CCl_4$, $BCl_3$, or the like, or a combination thereof. Exemplary bromine-based etch chemistry may include, but are not limited to, HBr, $Br_2$, $BBr_3$, or the like, or a combination thereof. Exemplary fluorine-containing gas may include, but are not limited to, $CF_4$, $SF_6$, $CH_2F_2$, $C_2H_4F_2$, $CHF_3$, $C_2F_6$, or the like, or a combination thereof.

In some embodiments, after the first etch scheme and prior to the second etch scheme, the exposed dielectric features 906 and the sacrificial gate electrode layer 1106 may be exposed to a gas mixture comprising a silicon-containing precursor (e.g., $SiCl_4$), a bromine-containing precursor (e.g., HBr), and an inert gas (e.g., Ar), followed by an oxidation process, to form a silicon oxide layer on the exposed dielectric features 906 and the sacrificial gate electrode layer 1106. The silicon oxide layer helps shrink the critical dimension (CD) of the openings 2102 so that the openings 2102 are extended into the substrate portions 102a, 102b in the depletion region 2101 with a proper CD. In such cases, an etch process using etch chemistries comprising fluorine-containing gas (e.g., $CF_4$) and an inert gas (e.g., Ar) may be performed to break through the silicon oxide layer.

In some embodiments, the second etch scheme is a cyclic process including repetitions of a plasma etching step and a break-through step. The plasma etching step may use an inert gas (e.g., Ar), an oxygen-containing gas (e.g., $O_2$), and any of the etch chemistries (e.g., HBr) mentioned in the second etch scheme above and be configured to remove the substrate portions 102a, 102b. The break-through step may use an inert gas (e.g., Ar) and/or any of the etch chemistries (e.g., $CF_4$) mentioned in the second etch scheme above and configured to remove the substrate portions 102a, 102b, the insulating material 402, and any debris/by-products formed during the plasma etching step. The plasma etching step may be performed for a first period of time (T1) and the break-through step may be performed for a second period of time (T2), and the ratio of T1:T2 may be about 3:1 to about 6:1. The cyclic process may be repeated 2 to 5 cycles. In some embodiments, the second etch process further includes an over-etch step following the cyclic process. The over-etch step may use an inert gas (e.g., Ar), an optional oxygen-containing gas (e.g., $O_2$), and any of the etch chemistries (e.g., HBr) mentioned in the second etch scheme above and be configured to remove additional portion of the substrate portions 102a, 102b and make sure the height H5 of the bottom portion 402c of the insulating material 402 is about 10 nm or below. In any cases, the second etch process is performed until a lowest point 2114 of the top surface of the substrate portion 102a, 102b at the isolation region 1804 is at a level lower than the bottom surface 2106 of the insulating material 402. In some embodiments, an interface 2203 (FIG. 22B) defined by the substrate portion 102a, 102b and the dielectric material 2201 (FIG. 22B) to be formed on the substrate portion 102a, 102b has a lowest point 2114 that is at a level lower than the bottom surface 2106 of the bottom portion 402c and within the accumulation region 2105.

An RF bias power may be supplied (to a pedestal upon which the semiconductor device structure 100 is disposed) during the first etch scheme, the removal of the silicon oxide layer, the plasma etching step of the second etch scheme, and the over-etch step to enable anisotropic etching. The use of the RF bias power also compensates for the etch selectivity needed for removing the insulating material 402 and the substrate portions 102a, 102b. The RF bias power and the cyclic process provide combined etching effect such that the upper portion 402a of the insulating material 402 is removed at greater amount than the middle portion 402b, resulting in the sidewall 2108 of the upper portion 402a with a radius of curvature as opposed to the straight surface of the sidewall 2110 of the middle portion 402b. In some embodiments, the sidewall 2110 of the middle portion 402b is slightly etched to form a radius of curvature that is less than the radius of curvature of the sidewall 2108 of the upper portion 402a. In any case, the RF bias power and the cyclic process are performed such that the middle portion 402b shows a gradual reduction of the diameter from the side adjacent the upper portion 402a towards the side adjacent the substrate portion 102a, 102b, as shown in FIG. 21C. With the use of the RF bias power and the cyclic process, the substrate portion 102a, 102b can be removed completely from the upper and middle portions 402a, 402b of the insulating material 402, leading to only small substrate portion 102a, 102b (i.e., silicon horn reduction as indicated by dotted circle C in FIG. 21C) remains in contact with the bottom portion 402c of the insulating material. In some embodiments, the highest point 2180 of the substrate portion 102a, 102b intersecting with the insulating material 402 is at or slightly below the bottom of the accumulation region 2105 (FIGS. 21A, 21B). Since the small substrate portion 102a, 102b remains on the sidewall 2112 of the bottom portion 402c is not within the depletion region 2101 where the well portion 107 is located, any leakage current that may otherwise occur in the well portion 107 (due to diffusion of charge carriers from S/D epitaxial features 1502 to the substrate portions 102a, 102b) between neighboring transistors at the active regions 1806 can be avoided.

An exemplary process for the second etch scheme may utilize an ICP/antenna plasma source driven by an RF power generator using a tunable frequency of about 13.56 MHz or about 27 MHz. The process chamber may be operated at a pressure in a range of about 3 mTorr to about 150 mTorr and a temperature of about 20 degrees Celsius to about 140 degrees Celsius. The RF power generator is operated to provide source power between about 100 W to about 1500 W, and the output of the RF power generator is controlled by a pulse signal having a duty cycle in a range of about 20% to 100%. An RF bias power operating in a range of about 10 W to about 600 W and at a frequency of about 13 MHz or about 1.2 MHz is applied to the pedestal during the second etch scheme. The second etch scheme is a cyclic process including the plasma etching step (using HBr, $O_2$, and Ar) and a break-through step (using Ar and/or $CF_4$) is used. The over-etch step is a plasma etch process using HBr, $O_2$, and Ar.

Due to the presence of the dielectric features 906, it is difficult for a single etching process to provide high etch selectivity when removing the first and second semiconductor layers 106, 108, the substrate portions 102a, 102b, and the insulating material 402, without affecting the integrality of the dielectric features 906. The use of the first and second etch schemes and the cyclic process provide distinct etching selectivity for different materials (e.g., semiconductor and oxides) and have the advantageous of multiple single-step etching (i.e., continuous etching) processes that are effective in removing the first and second semiconductor layers 106, 108, the substrate portions 102a, 102b, and the insulating material 402 while maintaining the integrality of the dielectric features 906.

In FIGS. 22A and 22B, the openings 2102 at the isolation regions 1804 are filled with a dielectric material 2201. The dielectric material 2201 and the dielectric feature 906 together form an isolation structure 2202. The dielectric material 2201 may be made of an oxygen-containing material, such as silicon oxide; a nitrogen-containing material, such as silicon nitride, silicon oxynitride (SiON), SiOCN, SiCN; a low-K dielectric material; or any suitable dielectric material. The dielectric material 2201 may include the same or different material than the insulating material 402, and may be formed by any suitable process, such as a CVD, PECVD, FCVD, or ALD process. Once the openings 2102 are filled, a planarization process, such as a CMP process, may be performed to remove portions of the dielectric material formed over the mask layer 1704'. The planarization process is performed until a portion of the mask layer 1704' is exposed. The isolation structures 2202 extend through the depletion region 2101 and into the accumulation region 2105 to block the path of current leakage in the well portion 107 between neighboring transistors at the active regions 1806.

Figures 23A, 23B:
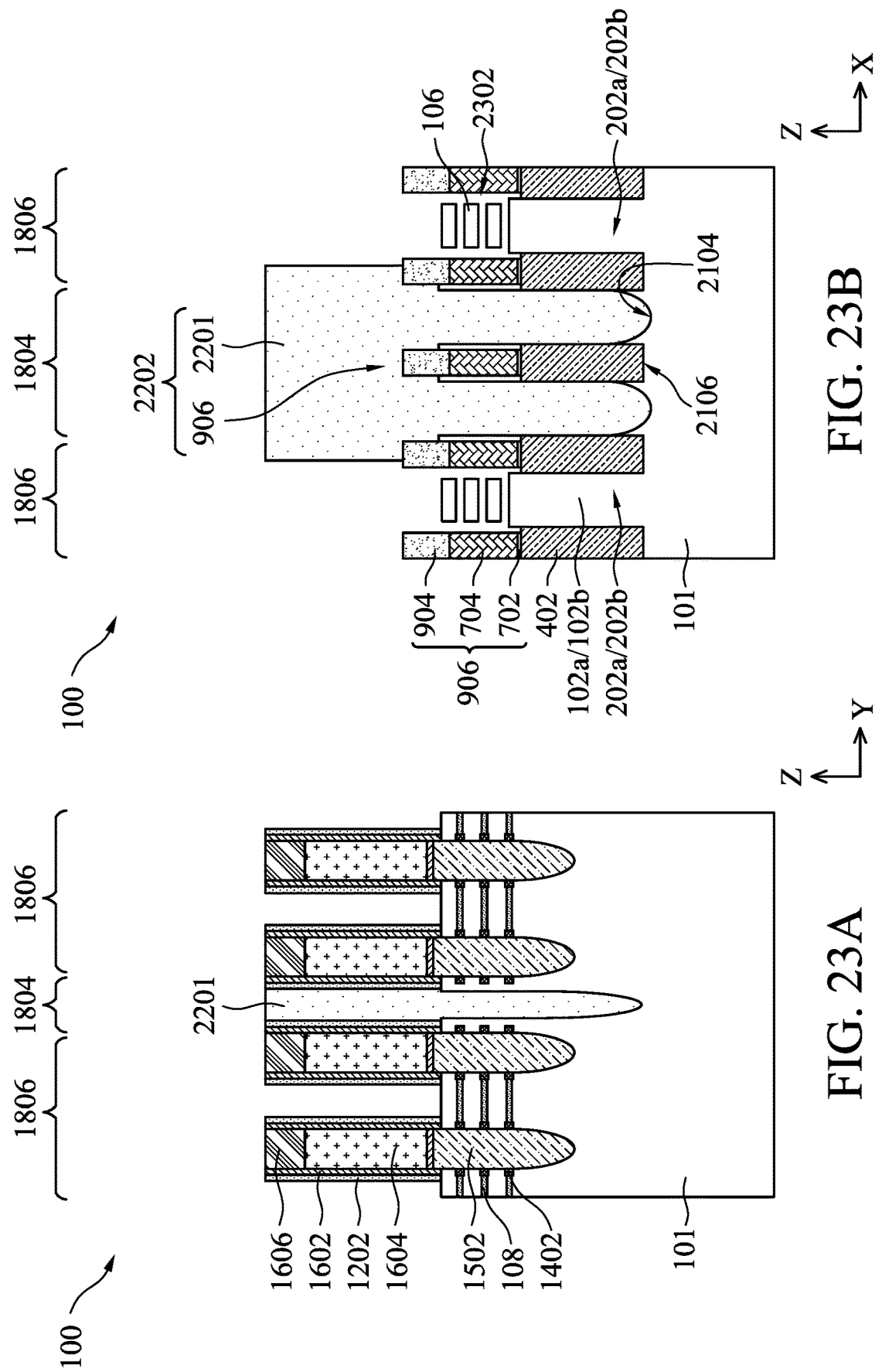

In FIGS. 23A and 23B, the sacrificial gate stacks 1102, the sacrificial gate dielectric layer 1104, the cladding layer 602, and the second semiconductor layers 108 are removed. The removal of the sacrificial gate stacks 1102 and the semiconductor layers 108 forms an opening 2302 between spacers 1202 and between first semiconductor layers 106. The ILD layer 1604 and the nitrogen-containing layer 1606 protect the S/D epitaxial features 1502 during the removal processes. The sacrificial gate stacks 1102 can be removed using plasma dry etching and/or wet etching. The sacrificial gate electrode layer 1106 may be first removed, followed by the removal of the sacrificial gate dielectric layer 1104, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 1106 and the sacrificial gate dielectric layer 1104 but not the spacers 1202, the isolation structures 2202, the ILD layer 1604, and the CESL 1602.

After the removal of the sacrificial gate stacks 1102, the cladding layers 602 are exposed. The removal of the cladding layers 602 and the second semiconductor layers 108 exposes the dielectric spacers 1402 and the first semiconductor layers 106. The removal process may be any suitable etch processes, such as dry etch, wet etch, or a combination thereof. The etch process may be a selective etch process that removes the cladding layers 602 and the second semiconductor layers 108 but not the spacers 1202, the ILD layer 1604, the CESL 1602, the isolation structures 2202, and the first semiconductor layers 106. As a result, a portion of the first semiconductor layers 106 not covered by the dielectric spacers 1402 is exposed in the opening 2302.

Figures 24A, 24B:
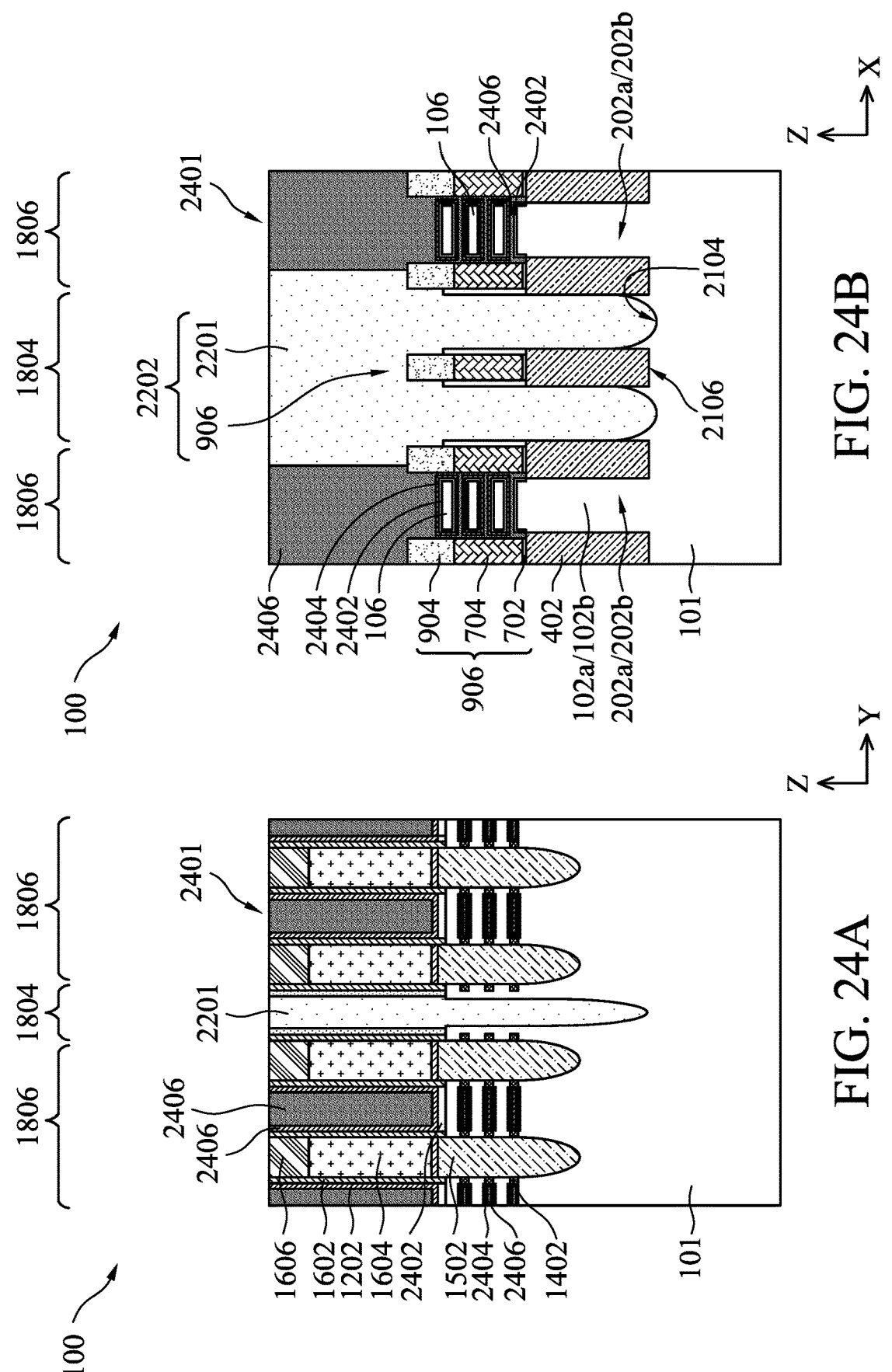

In FIGS. 24A and 24B, replacement gate structures 2401 are formed. The replacement gate structures 2401 each includes an interfacial layer (IL) 2402, a gate dielectric layer 2404, and a gate electrode layer 2406. The interfacial layer (IL) 2402 is formed to surround exposed surfaces of the first semiconductor layers 106. In some embodiments, the IL 2402 may also form on the well portion of the substrate 101. The IL 2402 may include or be made of an oxygen-containing material or a silicon-containing material, such as silicon oxide, silicon oxynitride, oxynitride, hafnium silicate, etc. In one embodiment, the IL 2402 is silicon oxide. The IL 2402 may be formed by CVD, ALD, a clean process, or any suitable process. Next, the gate dielectric layer 2404 is formed on the exposed surfaces of the semiconductor device structure 100. In some embodiments, the gate dielectric layer 2404 is formed to wrap around and in contact with the IL 2402. The gate dielectric layer 2404 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 2404 may be a conformal layer formed by a conformal process, such as an ALD process or a CVD process.

After formation of the IL 2402 and the gate dielectric layer 2404, the gate electrode layer 2406 is formed on the gate dielectric layer 2404. The gate electrode layer 2406 fills the openings 2302 (FIGS. 23A and 23B) and surrounds a portion of each of the first semiconductor layers 106. The gate electrode layer 2406 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 2406 may be formed by PVD, CVD, ALD, electro-plating, or other suitable method In FIGS. 25A and 25B, the gate electrode layer 2406 may be subject to one or more metal gate etching back (MGEB) processes. The MGEB processes are performed so that the top surfaces of the gate electrode layer 2406 and the gate dielectric layer 2404 are recessed to a level below the top surface of the spacers 1202. In some embodiments, the spacers 1202 are also recessed to a level below the top surface of the ILD layer 1604, as shown in FIG. 25A. A self-aligned contact layer 2504 is formed over the gate electrode layer 2406 and the gate dielectric layer 2404 between the spacers 1202. The self-aligned contact layer 2504 may be a dielectric material having an etch selectivity relative to the ILD layer 1604. In some embodiments, the self-aligned contact layer 2504 includes silicon nitride. A gate contact (not shown) may be subsequently formed in the self-aligned contact layer 2504 and in contact with the gate electrode layer 2406.

After formation of the self-aligned contact layer 2504, the nitrogen-containing layer 1606 is removed and contact openings are formed through the ILD layer 1604 and the CESL 1602 to expose the epitaxial S/D feature 1502. The self-aligned contact layer 2504 protects the gate electrode layer 2406 during formation of the contact openings. A silicide layer 2502 is then formed on the S/D epitaxial features 1502, and a contact 2506 is formed in the contact opening on the silicide layer 2502. The contact 2506 may include an electrically conductive material, such as Ru, Mo, Co, Ni, W, Ti, Ta, Cu, Al, TiN, or TaN. While not shown, a barrier layer (e.g., TiN, TaN, or the like) may be formed on sidewalls of the contact openings prior to forming the contacts 2506.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc.

The present disclosure provides an improved semiconductor device structure to prevent leakage current in a well portion between neighboring transistors by providing an isolation structure at an isolation region that is disposed between neighboring active regions of a substrate. The isolation structure extends through a depletion region in the substrate and into an accumulation region that is located below the depletion region. Therefore, any leakage current due to diffusion of charge carriers from S/D epitaxial features to the substrate is blocked from traveling through the substrate between neighboring transistors. As a result, the device performance required for aggressively scaled circuits and devices can be achieved.

A semiconductor device structure, along with methods of forming such, are described. An embodiment is a semiconductor device structure. The semiconductor device structure includes a substrate and an isolation structure disposed on the substrate and between two neighboring transistors. The isolation structure includes a dielectric feature, an insulating material disposed below the dielectric feature. The insulating material includes an upper portion comprising a first sidewall and a top surface in contact with the dielectric feature, and a bottom portion having a second sidewall, wherein the second sidewall is surrounded by and in contact with the substrate. The insulating material further includes a middle portion having a third sidewall disposed between the first sidewall and the second sidewall. The semiconductor device structure also includes a dielectric material in contact with the dielectric feature, the first sidewall, the third sidewall, and the substrate.

Another embodiment is a semiconductor device structure. The semiconductor device structure includes a first source/drain epitaxial feature formed over a substrate, a second source/drain epitaxial feature formed over the substrate and adjacent the first source/drain epitaxial feature, two or more first semiconductor layers disposed between the first source/drain epitaxial feature and the second source/drain epitaxial feature, a gate electrode layer surrounding a portion of one of the two or more first semiconductor layers, and an isolation structure disposed over the substrate and adjacent the second source/drain epitaxial feature. The isolation structure includes a dielectric feature, a dielectric material in contact with exposed surfaces of the dielectric feature, and a shallow trench isolation disposed below the dielectric feature. The shallow trench isolation includes a first portion adjacent the dielectric feature, wherein the first portion is surrounded by and in contact with the dielectric material. The shallow trench isolation also includes a second portion below the first portion, wherein the second portion is surrounded by and in contact with the substrate.

A further embodiment is a method. The method includes forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked, and the first, second, and third fin structures are separated from each other by a trench. The method includes forming an insulating material in the trenches to surround a portion of each of the first, second, and third fin structures. The method also includes forming a cladding layer on exposed surfaces of each of the first, second, and third fin structures, forming a dielectric feature on the insulating material in the trenches, forming a sacrificial gate structure over a portion of the first, second, and third fin structures, removing portions of the first, second, and third fin structures not covered by the sacrificial gate structure. The method also includes forming a source/drain feature on opposite sides of the sacrificial gate structure, wherein the source/drain feature is in contact with the plurality of first and second semiconductor layers of the first, second, and third fin structures. The method also includes forming a contact etch stop layer and an interlayer dielectric over the source/drain feature, and removing a portion of the sacrificial gate structure to expose a top of the second fin structure. The method also includes forming an opening in the exposed second fin structure, wherein the opening exposes the dielectric feature and a first sidewall portion of the insulating material, and a second sidewall portion of the insulating material remains in contact with each of the first, second, and third fin structure. The method also includes filling the opening with a dielectric material so that the dielectric feature and the first sidewall portion of the insulating material are in contact with the dielectric material, and removing the cladding layer and the plurality of second semiconductor layers to expose portions of the plurality of first semiconductor layers of the first, second, and third fin structures. The method further includes forming a gate electrode layer to surround at least the exposed portion of one of the plurality of first semiconductor layers of the first, second, and third fin structures The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked, and the first, second, and third fin structures are separated from each other by a trench;
   forming an insulating material in the trenches so that the insulating material surrounds a portion of each of the first, second, and third fin structures;
   forming a cladding layer on exposed surfaces of each of the first, second, and third fin structures;
   forming a dielectric feature on the insulating material in the trenches;
   forming a sacrificial gate structure over a portion of the first, second, and third fin structures;
   removing portions of the first, second, and third fin structures not covered by the sacrificial gate structure;
   forming a source/drain feature on opposite sides of the sacrificial gate structure, the source/drain feature being in contact with the plurality of first and second semiconductor layers of the first, second, and third fin structures;
   removing a portion of the sacrificial gate structure to expose a top of the second fin structure;
   forming an opening in the exposed second fin structure, wherein the opening exposes the dielectric feature and a first sidewall portion of the insulating material, and a second sidewall portion of the insulating material remains in contact with each of the first, second, and third fin structure, wherein the first sidewall portion has a first radius of curvature and the second sidewall portion has a second radius of curvature that is greater than the first radius of curvature;
   filling the opening with a dielectric material so that the dielectric feature and the first sidewall portion of the insulating material are in contact with the dielectric material;
   removing the cladding layer, the sacrificial gate structure, and the plurality of second semiconductor layers to expose portions of the plurality of first semiconductor layers of the first, second, and third fin structures; and
   forming a gate electrode layer to surround at least the exposed portion of one of the plurality of first semiconductor layers of the first, second, and third fin structures.

2. The method of claim 1, wherein forming an opening in the exposed second fin structure further comprises:
   performing a first etch process to remove the plurality of first and second semiconductor layers of the second fin structure; and
   once the first sidewall portion of the insulating material is exposed, performing a second etch process to remove a portion of the substrate and a portion of the insulating material.

3. The method of claim 2, wherein the second etch process is a cyclic process including repetitions of a first plasma etching step and a second plasma etching step, wherein the first plasma etching step uses a first etch chemistry configured to remove the substrate, and the second plasma etching step uses a second etch chemistry configured to remove the substrate and the insulating material.

4. The method of claim 3, further comprising:
   applying a bias power during the cyclic process.

5. The method of claim 2, wherein the second etch process is performed so that the first sidewall portion of the insulating material has a curved surface profile and a diameter that is gradually increased along a direction away from the dielectric feature.

6. The method of claim 1, wherein the first radius of curvature is greater than the second radius of curvature.

7. A method for forming a semiconductor device structure, comprising:
   forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked, and the first, second, and third fin structures are separated from each other by a trench;
   forming an insulating material in the trenches;
   forming a sacrificial gate structure over a portion of the first, second, and third fin structures;
   removing portions of the first, second, and third fin structures not covered by the sacrificial gate structure;
   removing a portion of the sacrificial gate structure to expose a top of the second fin structure;
   forming an opening in the exposed second fin structure to expose a first sidewall portion of the insulating material having a first radius of curvature, and a second sidewall portion of the insulating material having a second radius of curvature that is greater than the first radius of curvature, wherein the second sidewall portion remains in contact with the substrate forming the first, second, and third fin structures;
   filling the opening with a dielectric material so that the first sidewall portion of the insulating material is in contact with the dielectric material;
   removing the sacrificial gate structure and the plurality of second semiconductor layers to expose portions of the plurality of first semiconductor layers of the first, second, and third fin structures; and
   forming a gate electrode layer to surround at least the exposed portion of one of the plurality of first semiconductor layers of the first, second, and third fin structures.

8. The method of claim 7, wherein forming an opening in the exposed second fin structure further comprises:

performing a first etch process to remove the plurality of first and second semiconductor layers of the second fin structure; and performing a second etch process to remove a portion of the substrate and a portion of the insulating material.

9. The method of claim 8, wherein the first etch process is a plasma-based etch process.

10. The method of claim 8, wherein the first etch process is performed until the opening reaches a depth defined by a top surface of the insulating material.

11. The method of claim 7, wherein forming an opening in the exposed second fin structure further comprises:

performing an etch process to remove the plurality of first and second semiconductor layers of the second fin structure and a portion of the substrate, the etch process is performed until a sidewall of the insulating material is exposed.

12. The method of claim 9, wherein the second etch process is a cyclic process including repetitions of a first plasma etching step suitable for removing the substrate, and a second plasma etching step suitable for removing the substrate and the insulating material.

13. The method of claim 12, wherein the first plasma etching step is performed for a first period of time (T1) and the second plasma etching step is performed for a second period of time (T2), and the ratio of T1: T2 may be about 3:1 to about 6:1.

14. The method of claim 12, wherein the second etch process is performed until a lowest point of a top surface of the substrate is at a level lower than a bottom surface of the insulating material.

15. The method of claim 12, further comprising:

during the first etch process, applying a bias power to a pedestal upon which the semiconductor device structure is disposed.

16. The method of claim 15, wherein the bias power is applied during the first etch process and the first plasma etching step.

17. A method for forming a semiconductor device structure, comprising:

forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked;

forming an insulating material over the substrate and around the first, second, and third fin structures;

forming a sacrificial gate structure over a portion of the first, second, and third fin structures;

removing portions of the first, second, and third fin structures not covered by the sacrificial gate structure;

removing a portion of the sacrificial gate structure to expose a top of the second fin structure;

performing a fin-cut process to form an opening in the exposed second fin structure such that a bottom of the opening is at a level lower than a bottom surface of the insulating material, and a bottom portion of the insulating material remains in contact with a small portion of the substrate forming the first, second, and third fin structures, wherein the bottom portion of the insulating material has a sidewall that is formed with a first radius of curvature, and an upper portion of the insulating material has a sidewall that is formed with a second radius of curvature that is greater than the first radius of curvature;

filling the opening with a dielectric material;

removing the sacrificial gate structure and the plurality of second semiconductor layers to expose portions of the plurality of first semiconductor layers of the first, second, and third fin structures; and forming a gate electrode layer to surround at least the exposed portion of one of the plurality of first semiconductor layers of the first, second, and third fin structures.

18. The method of claim 17, wherein a middle portion of the insulating material is formed with a sidewall that is substantially flat by the fin-cut process.

19. The method of claim 17, wherein the fin-cut process comprises a first etch scheme and a second etch scheme, in which the first etch scheme is a plasma-based etch process employing one or more etchants that selectively remove the first and second semiconductor layers, and the second etch scheme is a cyclic process including repetitions of a first plasma etching step suitable for removing the substrate, and a second plasma etching step suitable for removing the substrate and the insulating material.

20. The method of claim 19, further comprising:

during the first and second etch schemes, applying a bias power to a pedestal upon which the semiconductor device structure is disposed.

\* \* \* \* \*